US008754359B2

(12) United States Patent
Yu et al.

(10) Patent No.: US 8,754,359 B2
(45) Date of Patent: *Jun. 17, 2014

(54) NANOWIRE PHOTO-DETECTOR GROWN ON A BACK-SIDE ILLUMINATED IMAGE SENSOR

(75) Inventors: Young-June Yu, Cranbury, NJ (US); Munib Wober, Topsfield, MA (US)

(73) Assignee: Zena Technologies, Inc., Cambridge, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/494,661

(22) Filed: Jun. 12, 2012

(65) Prior Publication Data

US 2012/0298843 A1  Nov. 29, 2012

Related U.S. Application Data

(62) Division of application No. 12/633,323, filed on Dec. 8, 2009.

(51) Int. Cl.
*H01L 31/00* (2006.01)

(52) U.S. Cl.
USPC ......................................... 250/214.1; 977/762

(58) Field of Classification Search
USPC .............. 250/214.1, 214 R; 257/21; 977/762
See application file for complete search history.

(56) References Cited

U.S. PATENT DOCUMENTS

| 1,918,848 | A | 7/1933 | Land |
| 3,903,427 | A | 9/1975 | Pack |
| 4,017,332 | A | 4/1977 | James |
| 4,357,415 | A | 11/1982 | Hartman |
| 4,387,265 | A | 6/1983 | Dalal |
| 4,400,221 | A | 8/1983 | Rahilly |
| 4,443,890 | A | 4/1984 | Eumurian |
| 4,513,168 | A | 4/1985 | Borden |
| 4,620,237 | A | 10/1986 | Traino |
| 4,678,772 | A | 7/1987 | Segal et al. |
| 4,827,335 | A | 5/1989 | Saito |
| 4,846,556 | A | 7/1989 | Haneda |
| 4,880,613 | A | 11/1989 | Satoh |
| 4,896,941 | A | 1/1990 | Hayashi |
| 4,950,625 | A | 8/1990 | Nakashima |

(Continued)

FOREIGN PATENT DOCUMENTS

| EP | 0809303 | 9/2006 |
| GB | 2348399 A | 4/2000 |

(Continued)

OTHER PUBLICATIONS

Adler, Nanowire Lawns Make for Sheets of Image Sensors, NewScientist.com, Jul. 28, 2008.

(Continued)

*Primary Examiner* — Thanh Luu
(74) *Attorney, Agent, or Firm* — Pillsbury Winthrop Shaw Pittman LLP

(57) ABSTRACT

An embodiment relates to a device comprising a substrate having a front side and a back-side that is exposed to incoming radiation, a nanowire disposed on the substrate and an image sensing circuit disposed on the front side, wherein the nanowire is configured to be both a channel to transmit wavelengths up to a selective wavelength and an active element to detect the wavelengths up to the selective wavelength transmitted through the nanowire.

16 Claims, 12 Drawing Sheets

(56) References Cited

U.S. PATENT DOCUMENTS

| | | |
|---|---|---|
| 4,971,928 A | 11/1990 | Fuller |
| 4,972,244 A | 11/1990 | Buffet |
| 5,096,520 A | 3/1992 | Faris |
| 5,124,543 A | 6/1992 | Kawashima |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unul |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang |
| 5,943,463 A | 8/1999 | Unuma |
| 5,968,528 A | 10/1999 | Deckner et al. |
| 6,033,582 A | 3/2000 | Lee |
| 6,037,243 A | 3/2000 | Ha |
| 6,046,466 A | 4/2000 | Ishida |
| 6,074,892 A | 6/2000 | Bowers |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto |
| 6,463,204 B1 | 10/2002 | Ati |
| 6,542,231 B1 | 4/2003 | Garrett |
| 6,563,995 B2 | 5/2003 | Keaton |
| 6,566,723 B1 | 5/2003 | Vook |
| 6,680,216 B2 | 1/2004 | Kwasnick |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,109,517 B2 | 9/2006 | Zaidi |
| 7,153,720 B2 | 12/2006 | Augusto |
| 7,163,659 B2 | 1/2007 | Stasiak |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang |
| 7,306,963 B2 | 12/2007 | Linden |
| 7,307,327 B2 | 12/2007 | Bahl |
| 7,311,889 B2 | 12/2007 | Awano |
| 7,330,404 B2 | 2/2008 | Peng |
| 7,335,962 B2 | 2/2008 | Mouli |
| 7,336,860 B2 | 2/2008 | Cyr |
| 7,358,583 B2 | 4/2008 | Reznik |
| 7,381,966 B2 | 6/2008 | Starikov |
| 7,416,911 B2 | 8/2008 | Heath et al. |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li et al. |
| 7,521,322 B2 | 4/2009 | Tang |
| 7,524,694 B2 | 4/2009 | Adkisson |
| 7,582,857 B2 | 9/2009 | Gruev |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa et al. |
| 7,655,860 B2 | 2/2010 | Parsons |
| 7,663,202 B2 | 2/2010 | Wang et al. |
| 7,692,860 B2 | 4/2010 | Sato et al. |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,790,495 B2 | 9/2010 | Assefa |
| 7,888,155 B2 | 2/2011 | Chen |
| 8,030,729 B2 | 10/2011 | Quitoriano |
| 8,035,184 B1 | 10/2011 | Dutta |
| 8,049,203 B2 | 11/2011 | Samuelson |
| 8,063,450 B2 | 11/2011 | Wernersson |
| 8,067,299 B2 | 11/2011 | Samuelson |
| 8,084,728 B2 | 12/2011 | Tsang |
| 8,093,675 B2 | 1/2012 | Tsunemi |
| 8,118,170 B2 | 2/2012 | Sato |
| 8,143,658 B2 | 3/2012 | Samuelson |
| 8,193,524 B2 | 6/2012 | Bjoerk |
| 8,208,776 B2 | 6/2012 | Tokushima |
| 8,212,136 B2 | 7/2012 | Landis |
| 8,212,138 B2 | 7/2012 | Landis |
| 8,222,705 B2 | 7/2012 | Ogino |
| 8,242,353 B2 * | 8/2012 | Karg ............................. 136/256 |
| 8,269,985 B2 | 9/2012 | Wober |
| 8,274,039 B2 | 9/2012 | Wober et al. |
| 8,299,472 B2 * | 10/2012 | Yu et al. ......................... 257/72 |
| 8,330,090 B2 | 12/2012 | Agarwal |
| 8,384,007 B2 * | 2/2013 | Yu et al. ..................... 250/214.1 |
| 8,455,857 B2 | 6/2013 | Samuelson |
| 8,546,742 B2 | 10/2013 | Wober |
| 2002/0003201 A1 | 1/2002 | Yu |
| 2002/0020846 A1 | 2/2002 | Pi |
| 2002/0021879 A1 | 2/2002 | Lee |
| 2002/0104821 A1 | 8/2002 | Bazylenkob |
| 2002/0109082 A1 | 8/2002 | Nakayama |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao |
| 2003/0089899 A1 | 5/2003 | Lieber |
| 2003/0103744 A1 | 6/2003 | Koyama |
| 2003/0132480 A1 | 7/2003 | Chau |
| 2003/0189202 A1 | 10/2003 | Li |
| 2003/0227090 A1 | 12/2003 | Okabe |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea et al. |
| 2004/0109666 A1 | 6/2004 | Kim |
| 2004/0118337 A1 | 6/2004 | Mizutani |

(56) References Cited

U.S. PATENT DOCUMENTS

| | | |
|---|---|---|
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton et al. |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0261840 A1 | 12/2004 | Schmit et al. |
| 2005/0009224 A1 | 1/2005 | Yang et al. |
| 2005/0082676 A1 | 4/2005 | Andry |
| 2005/0087601 A1 | 4/2005 | Gerst, III |
| 2005/0095699 A1 | 5/2005 | Miyauchi |
| 2005/0116271 A1 | 6/2005 | Kato |
| 2005/0133476 A1 | 6/2005 | Islam |
| 2005/0161662 A1 | 7/2005 | Majumdar et al. |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0242409 A1 | 11/2005 | Yang |
| 2005/0284517 A1 | 12/2005 | Shinohara |
| 2006/0011362 A1 | 1/2006 | Tao |
| 2006/0038990 A1 | 2/2006 | Habib et al. |
| 2006/0113622 A1 | 6/2006 | Adkisson |
| 2006/0121371 A1 | 6/2006 | Wu |
| 2006/0146323 A1 | 7/2006 | Bratkovski |
| 2006/0162766 A1 | 7/2006 | Gee et al. |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn |
| 2007/0108371 A1 | 5/2007 | Stevens |
| 2007/0114622 A1 | 5/2007 | Adkisson |
| 2007/0120254 A1* | 5/2007 | Hurkx et al. .................. 257/745 |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1* | 7/2007 | Choi et al. .................... 257/292 |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0065451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu et al. |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149914 A1* | 6/2008 | Samuelson et al. ................ 257/9 |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0266556 A1 | 10/2008 | Kamins |
| 2008/0277646 A1 | 11/2008 | Kim et al. |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar et al. |
| 2009/0001498 A1 | 1/2009 | Wang |
| 2009/0020150 A1 | 1/2009 | Atwater et al. |
| 2009/0032687 A1 | 2/2009 | Lapstun |
| 2009/0046362 A1 | 2/2009 | Guo et al. |
| 2009/0046749 A1 | 2/2009 | Mizuuchi |
| 2009/0050204 A1 | 2/2009 | Habib |
| 2009/0057650 A1 | 3/2009 | Lieber |
| 2009/0072145 A1 | 3/2009 | Peczalski et al. |
| 2009/0121136 A1 | 5/2009 | Gruss et al. |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1* | 7/2009 | Quitoriano et al. ............. 257/12 |
| 2009/0189145 A1 | 7/2009 | Wang et al. |
| 2009/0199597 A1 | 8/2009 | Danley |
| 2009/0201400 A1 | 8/2009 | Zhang |
| 2009/0206405 A1 | 8/2009 | Doyle |
| 2009/0224245 A1 | 9/2009 | Umezaki |
| 2009/0224349 A1 | 9/2009 | Gambino |
| 2009/0230039 A1 | 9/2009 | Hoenig et al. |
| 2009/0233445 A1 | 9/2009 | Lee |
| 2009/0243016 A1 | 10/2009 | Kawahara |

(56) References Cited

U.S. PATENT DOCUMENTS

| | | |
|---|---|---|
| 2009/0244514 A1 | 10/2009 | Jin |
| 2009/0260687 A1 | 10/2009 | Park |
| 2009/0261438 A1 | 10/2009 | Choi et al. |
| 2009/0266418 A1 | 10/2009 | Hu et al. |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1* | 12/2009 | Cohen .......................... 438/73 |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0090341 A1 | 4/2010 | Wan et al. |
| 2010/0101633 A1 | 4/2010 | Park et al. |
| 2010/0104494 A1 | 4/2010 | Meng |
| 2010/0110433 A1 | 5/2010 | Nedelcu et al. |
| 2010/0116976 A1 | 5/2010 | Wober |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke |
| 2010/0244169 A1 | 9/2010 | Maeda |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang |
| 2010/0302440 A1 | 12/2010 | Wober |
| 2010/0304061 A1 | 12/2010 | Ye |
| 2010/0308214 A1 | 12/2010 | Wober |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su |
| 2011/0050042 A1 | 3/2011 | Choi et al. |
| 2011/0080508 A1 | 4/2011 | Katsuno |
| 2011/0127490 A1 | 6/2011 | Mi |
| 2011/0133060 A1 | 6/2011 | Yu |
| 2011/0133160 A1 | 6/2011 | Yui |
| 2011/0135814 A1 | 6/2011 | Miyauchi |
| 2011/0139176 A1 | 6/2011 | Cheung |
| 2011/0146771 A1 | 6/2011 | Chuang et al. |
| 2011/0147870 A1 | 6/2011 | Ang |
| 2011/0180894 A1* | 7/2011 | Samuelson et al. ........... 257/438 |
| 2011/0195577 A1 | 8/2011 | Kushibiki |
| 2011/0226937 A1 | 9/2011 | Yu |
| 2011/0248315 A1 | 10/2011 | Nam et al. |
| 2011/0249219 A1 | 10/2011 | Evans et al. |
| 2011/0249322 A1 | 10/2011 | Wang et al. |
| 2011/0253982 A1 | 10/2011 | Wang |
| 2011/0272014 A1 | 11/2011 | Mathai et al. |
| 2011/0297214 A1 | 12/2011 | Kim |
| 2011/0309237 A1 | 12/2011 | Seo |
| 2011/0315988 A1 | 12/2011 | Yu |
| 2011/0316106 A1 | 12/2011 | Kim |
| 2012/0009714 A1 | 1/2012 | Mouli |
| 2012/0029328 A1 | 2/2012 | Shimizu |
| 2012/0075513 A1 | 3/2012 | Chipman et al. |
| 2012/0196401 A1 | 8/2012 | Graham et al. |
| 2012/0258563 A1 | 10/2012 | Ogino |

FOREIGN PATENT DOCUMENTS

| | | |
|---|---|---|
| JP | 359013708 A | 1/1984 |
| JP | 59198413708 | 1/1984 |
| JP | 2002151 | 5/2002 |
| JP | 2007201091 | 8/2007 |
| TW | 200845402 | 11/2008 |
| TW | 200915551 | 4/2009 |
| WO | 8603347 | 6/1986 |
| WO | 0002379 | 1/2000 |
| WO | WO03107439 | 12/2003 |
| WO | 2005064337 | 7/2005 |
| WO | 2005252210 | 9/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.

Baillie et al., 'Zero-space microlenses for CMOS image sensors: optical modeling and lithographic process development', Publication Date May 2004, http://adsabs.harvard.edu/abs/2004SPIE.5377.953B, pp. 1-2.

Baomin Wang and Paul W. Leu, Nanotechology 23 (2012) 194003, 7 pages.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Chung, Sung-Wook et al. Silicon Nanowire Devices. Applied Physics Letters, vol. 76, No. 15 (Apr. 10, 2000), pp. 2068-2070.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

CMOS image sensor pixel optical efficiency and optical crosstalk optimization using FDTD Solutions' www.lumerical.com/fdtd_microlens/cmos_image_sensor_pixel_microlens.php, Mar. 19, 2009.

Deptuch et al., Vertically Integrated Circuits at Fermilab, IEEE Transactions on Nuclear Science, Aug. 2010, vol. 54, Issue 4, pp. 2178-2186.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.

Fang et al., Fabrication of Slantingly-Aligned Silicon Nanowire Arrays for Solar Cell Applications, Nanotechnology, 2008, vol. 19, No. 25.

Furumiya, et al. 'High-sensitivity and no-crosstalk pixel technology for embedded CMOS image sensor'; IEEE Electron Device Letters, vol. 48, No. 10, Oct. 2001.

Gadelrab et al., The Source-Gated Amorphous Silicon Photo-Transistor, IEEE Transactions on Electron Devices, Oct. 1997, vol. 44, No. 10, pp. 1789-1794.

Gambino et al., 'CMOS Imager with Copper Wiring and Lightpipe,' Electron Devices Meeting, 2006. IEDM '06, International Publication Date: Dec. 11-13, 2006, pp. 1-4.

Garnett et al., Light Trapping in Silicon Nanowire Solar Cells, Nanoletters, Jan. 28, 2010, vol. 10, No. 3, pp. 1082-1087.

(56) References Cited

OTHER PUBLICATIONS

Ge et al., Orientation-Controlled Growth of Single-Crystal Silicon-Nanowire Arrays, Advanced Materials, Jan. 18, 2005, vol. 17, No. 1, pp. 56-61.
Guillaumée, et al., Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
International Preliminary Report and Written Opinion re PCT/US2010/059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.
International Preliminary Report and Written Opinion re PCT/US2010/059504, mailed Jun. 21, 2012.
International Preliminary Report on Patentability for PCT International Application No. PCT/US2010/035722, mailed Nov. 3, 2011.
International Preliminary Report on Patentability for PCT International Patent Application No. PCT/U62009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
International Search Report and Written Opinion re PCT/US2011/57325, mailed Jun. 22, 2012.
Jin-Kon Kim; 'New Functional Nanomaterials Based on Block Copolymers' http://www.ziu.edu.cn/adver/subjectizyhd/jz0707061313.html, Jul. 7, 2011.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et. al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide As Dopant Source for Shallow Doping of Silicon, Meeting Abstract 943, 217th ECS Meeting, MA2010-01, Apr. 25-30, 2010, Vancouver Canada, EI—Advanced Gate Stack, Source / Drain, and Channel Engineering for Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n. Nanowire Photovoltaic Devices. Nano Letters. 2008, vol. 8, No. 10, 3456-3460.
Kim et al., Electronic Structure of Vertically Aligned Mn-Doped $CoFe_2O_4$ Nanowires and Their Application as Humidity Sensors and Photodetectors, Journal of Physical Chemistry C, Apr. 7, 2009.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol.__ 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005. 55th Proceedings. pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: http://spie.org/x40194.xml?ArticleID=x40194.
Loose et al., CMOS Detector Technology, Scientific Detector Workshop, Sicily, 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N.L. Dmitruk, et al.; 'Modeling and Measurement of Optical Response of 1D Array of Metallic Nanowires for Sensing and Detection Application'; 26th International Conference on Microelectronics (Miel 2008), Nis, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.

(56) References Cited

OTHER PUBLICATIONS

Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol._ 15, No. 6.
Reynard Corporation; 'Anti-Reflection Coatings (AR)', http://www.reynardcorp.com/coating_anti_reflection.php, undated.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:http://news.harvard.edu/gazette/story/2010/02/digging-deep-into-diamonds/.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Schmidt et al., Realization of a Silicon Nanowire Vertical Surround-Gate Field-Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society, Fall 2007.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14 μm CMOS image sensor'; IEEE International Electron Devices Meeting, Dec. 13-15, 2004; IEDM Technical Digest, pp. 997-1000.
U.S. Office Action for U.S. Appl. No. 12/573,582, dated Jun. 28, 2012.
U.S. Office Action for U.S. Appl. No. 13/494,661, notification date Nov. 7, 2012.
Verheijen, Marcel A. et al. Growth Kinetics of Heterostructured GaP-GaAs Nanowires. J. Am. Chem. Soc. 2006, 128, 1353-1359.
Wagner, R.S. And Ellis, W.C. Vapor-Liquid-Solid Mechanism of Single Crystal Growth. Applied Physics Letters. vol. 4, No. 5 (Mar. 1, 1964), pp. 89-90.
Wang, Introduction to Nanotechnology—Where Opportunities arise Great Future Being Built from Small Things, Fall 2008.
William Shockley and H. Queisser, Detailed Balance Limit of Efficiency of p-n Junction Solar Cells, J. of Appl. Physics, Mar. 1961, 32(3).
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
International Preliminary Search Report on Patentability of PCT/US201-057325, mailed May 2, 2013.
Taiwanese Office Action of Taiwan Patent Application No. 099116881, issued Jul. 18, 2013 (8 pages).
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
Mei-Ling Kuo et al., "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.

* cited by examiner

Front Side

NANOWIRE PHOTO-DETECTOR GROWN ON A BACK-SIDE ILLUMINATED IMAGE SENSOR

CROSS REFERENCE TO RELATED APPLICATIONS

This application is a divisional of U.S. patent application Ser. No. 12/633,323, filed on Dec. 8, 2009. The content of which is incorporated by reference herein in its entirety. This application is related to U.S. application Ser. No. 12/270,233, filed Nov. 13, 2008, entitled "VERTICAL WAVEGUIDES WITH VARIOUS FUNCTIONALITY ON INTEGRATED CIRCUITS," which is incorporated herein in its entirety by reference. This application is related to U.S. application Ser. No. 12/633,297, filed Dec. 8, 2009, entitled "MANUFACTURING NANOWIRE PHOTO-DETECTOR GROWN ON A BACK-SIDE ILLUMINATED IMAGE SENSOR," which is incorporated herein in its entirety by reference. This application is related to U.S. application Ser. No. 12/621,497, filed Nov. 19, 2009, entitled "NANOWIRE CORE-SHELL LIGHT PIPES," which is incorporated herein in its entirety by reference.

FIELD OF INVENTION

The embodiments relate to light detecting devices such as a photodiode (PD) comprising of a nanowire grown on a back-side-illuminated image sensor.

BACKGROUND

An image sensor has a large number of identical sensor elements (pixels), often greater than 1 million, in a Cartesian (square) grid. The distance between adjacent pixels is called the pitch (p). For square pixels, the area of a pixel is $p^2$. The area of the photosensitive element, i.e., the area of the pixel that is sensitive to light for conversion to an electrical signal, is normally only about 20% to 30% of the overall surface area of the pixel.

Conventional color image sensors are fabricated with colored filters arranged in a Bayer configuration. A common example of a conventional Bayer filter pattern has a color scheme including red, green, and blue filters (RGB). The Bayer filter pattern is 50% green, 25% red and 25% blue, hence is also referred to GRGB or other permutation such as RGGB. In this arrangement, there are twice as many green elements as red or blue. This is used to mimic the human eye's greater sensitivity to the green light.

The complementary metal-oxide semiconductor (CMOS) Image Sensor (CIS) has been one of the early adopters of 3D integrated circuits (IC) integration offering low cost/high volume cameras for cell phones and other applications. One type of CIS is the back-side-illuminated (BSI) CIS. Smaller pixels result in higher resolution, smaller devices, and lower power and cost. Shrinking the pixel size in CMOS image sensors should be designed without degrading performance and image quality. As smaller and smaller pixels are fabricated on CMOS image sensors, however, the area of the photosensitive region becomes smaller thus leading to image quality deterioration.

The trends in BSI CIS are described in an article entitled "Backside Illumination (BSI) Architecture next for CMOS Image Sensors," Semiconductor International, Aug. 3, 2008.

To solve this problem, companies worked on backside-illuminated (BSI) technology. OmniVision is an illustrative embodiment of such companies. OmniVision announced in May 2008 that it had developed the OmniBSI™ technology that involves turning the image sensor upside down and applying the color filters and micro lenses to the backside of the pixels so that the sensor can collect light through the area that has no circuitry, i.e. the backside.

The reason for the better performance of the BSI is higher fill factor, i.e. the amount of light that can be collected in a single pixel. The various metal layers on top of a front-illuminated sensor limit the light that can be collected in a pixel. As pixel sizes get smaller, the fill factor gets worse. BSI provides the most direct path for light to travel into the pixel, avoiding light blockage by the metal interconnect and dielectric layers on the top-side of the sensor die (see FIG. 1; source: OmniVision). In FIG. 1, the FSI pixel is a front side illuminated pixel while the BSI pixel is a back-side illuminated pixel. Note that as shown in FIG. 1, the terms back and front in BSI and FSI relates to the side from where the pixel is illuminated with relation to the side where the various metal layers are located.

OmniVision's BSI CMOS sensor has a pixel size of 0.9-1.4 µm for an 8-megapixel product. On the heels of the OmniVision announcement, Sony announced a BSI technology for CMOS sensors for 5-Mpixel camcorders or digital cameras with 1.75 µm CMOS pixel technology.

ST Micro has also demonstrated the feasibility of manufacturing 3-megapixel 1.45 µm CMOS image sensors using BSI technology. It claims to obtain a quantum efficiency (QE) (QE=the percentage of photons that are converted into electrons) of greater than 60%.

ST Micro's technology is based on SOi, wafer bonding and thinning technologies. In the ST Micro BSI scheme, after the final metal layers are created, a passivation layer and subsequent oxide wafer-bonding layer (WBL) are deposited. The WBL is planarized and a support wafer is bonded to the processed wafer, the CIS wafer is then thinned. Reported ST Micro Process flow:
  SOI wafer
  CMOS process
  Wafer bonding layer (WBL) deposit and planarize
  Wafer bonding
  Thinning
  Anti-reflective coating (ARC)
  Pad opening
  Color filters and micro-lens attached A quick search of the patent landscape turned up U.S. Pat. No. 6,429,036 "Backside illumination of CMOS image sensor" (Micron); U.S. Pat. No. 5,244,817 "Method of making backside illuminated image sensors" (Kodak); US Pub. No. 2007/0152250 "CMOS image sensor with backside illumination" (MagnaChip); US Pub. No. 2008/0044984 "Methods of avoiding wafer breakage during manufacture of backside illuminated image sensors." (TSMC); U.S. Pat. No. 6,168,965 "Method for Making Backside Illuminated Image Sensor" (Tower Semi); US Pub. No. 2007/0052050 "Backside thinned image sensor with integrated lens stack" (IMEC).

Sarnoff (now a subsidiary of SRI International) has also announced entry into the CIS technology arena. At the 2008 Semicon West, Sarnoff introduced Ultra-Sense™, a thinning technology that they have developed for high-performance, SOI based, back-illuminated image sensors. After processes are completed on the frontside of the CIS wafer, the wafer backside is thinned. Sarnoff indicated that its backside thinning process using SOI wafers gives better control of the thinning process that improves pixel quality, lowers cost and improves the yield. In order to distinguish the three components of light so that the colors from a full color scene can be reproduced, the image sensors is the use of RBG filters such that two of the components of light are filtered out for each pixel using a filter. For example, the red pixel has a filter that absorbs green and blue light, only allowing red light to pass to the sensor. Thus, generally less than about one-third of the photon impinging on the image sensor are transmitted to the photosensitive element such as a photodiode and converted into electrons.

SUMMARY

The embodiments herein relate to a device comprising a substrate having a front side and a back-side that is exposed to incoming radiation, a waveguide comprising a nanowire disposed on the substrate and an image sensing circuit disposed on the front side, wherein the nanowire is configured to be both a channel to transmit wavelengths of the incoming radiation up to a selective wavelength and an active element to detect the wavelengths of the incoming radiation up to the selective wavelength transmitted through the nanowire.

In one illustrative embodiment, the nanowire is not transparent and disposed within a cavity in the substrate, the front side is not exposed to the incoming radiation, and the image sensing circuit is on or within a layer on the front-side of the substrate.

In one illustrative embodiment, the device does not include a color filter nor infra-red filter.

In one illustrative embodiment, the nanowire comprises a semiconductor.

The device can further comprise, for example, a lens structure or an optical coupler over the nanowire.

In one illustrative embodiment, the lens structure or the optical coupler is operably coupled to the nanowire.

The device can further comprise, for example, an anti-reflective layer disposed on the substrate.

In one illustrative embodiment, the active element is configured to be a photodiode, a charge storage capacitor, or combinations thereof.

In one illustrative embodiment, the device is an image sensor.

In one illustrative embodiment, the selective wavelength is a function of the diameter of the nanowire.

The device can further comprise, for example, a vertical photogate.

In one illustrative embodiment, the nanowire is configured to convert energy of the electromagnetic radiation transmitted through the nanowire and to generate electron hole-pairs (excitons).

In one illustrative embodiment, the nanowire comprises a pn or pin junction that is configured to detect the excitons generated in the nanowire.

The device can further comprise, for example, an insulator layer around the nanowire and a metal layer around the insulator layer to form a capacitor that is configured to collect the excitons generated in the nanowire and store charge in the capacitor.

The device can further comprise, for example, metal contacts that connect to the metal layer and nanowire to control and detect the charge stored in the capacitor.

The device can further comprise, for example, a cladding. In one illustrative embodiment, the cladding is configured to be a channel to transmit the wavelengths of the electromagnetic radiation beam that do not transmit through the nanowire.

The device can further comprise, for example, a cladding. In one illustrative embodiment, the cladding comprises a passive waveguide.

The device can further comprise, for example, a peripheral photosensitive element. In one illustrative embodiment, the peripheral photosensitive element is operably coupled to the cladding.

In one illustrative embodiment, cladding comprises more than one layers. In one illustrative embodiment, the more than one layers have indices of refraction consecutively smaller than a index of refraction the nanowire.

In one illustrative embodiment, the peripheral photosensitive element is located on or within a substrate.

In one illustrative embodiment, the lens structure or the optical coupler comprises a first opening and a second opening with the first opening being larger than the second opening, and a connecting surface extending between the first and second openings.

In one illustrative embodiment, the connecting surface comprises a reflective surface.

The device can further comprise, for example, a color or IR filter.

Another embodiment relates to a compound light detector comprising at least two different devices, each device comprising a substrate having a front side and a back-side that is exposed to incoming radiation, a waveguide comprising a nanowire disposed on the substrate and an image sensing circuit disposed on the front side, wherein the nanowire is configured to be both a channel to transmit wavelengths of the incoming radiation up to a selective wavelength and an active element to detect the wavelengths of the incoming radiation up to the selective wavelength transmitted through the nanowire, and the compound light detector is configured to reconstruct a spectrum of wavelengths of an electromagnetic radiation beam.

In one illustrative embodiment, the at least two different devices have nanowires having different diameters.

The compound light detector can further comprise, for example, a cladding surrounding the nanowire and of one or more different materials. In one illustrative embodiment, the cladding permits electromagnetic radiation of wavelengths beyond the selective wavelength to remains within the cladding and be transmitted to a peripheral photosensitive element.

In one illustrative embodiment, a plurality of light detectors are arranged on a regular tessellation, a square lattice, an hexagonal lattice, or in a different lattice arrangement.

In one illustrative embodiment, the spectrum of wavelengths comprises wavelengths of visible light, IR or combinations thereof.

In one illustrative embodiment, the first device comprises a core of a different diameter than that of the second device and the spectrum of wavelengths comprises wavelengths of visible light, IR or combinations thereof.

In one illustrative embodiment, the compound light detector is configured to resolve black and white or luminescence information contained in the electromagnetic radiation beam.

In one illustrative embodiment, the compound light detector is configured to detect energies of the electromagnetic radiation of four different ranges of wavelengths.

In one illustrative embodiment, the energies of the electromagnetic radiation of the four different ranges of wavelengths are combined to construct red, green and blue colors.

In one illustrative embodiment, at least some of the at least one of the devices does not include a color or infra-red filter.

Yet another embodiment relates to a waveguide comprising a substrate and at least one upstanding nanowire protruding from the substrate, a pn-junction contributing to the formation of an active region to absorb the light.

In one illustrative embodiment, a shell-like structure encloses the nanowire or portion thereof.

In one illustrative embodiment, the nanowire has a first effective refractive index, $n_w$, and a material surrounding at least a portion of the nanowire to form a cladding having a second effective refractive index, $n_c$, and the first refractive index is larger than the second refractive index, $n_w > n_c$ configured to create waveguiding properties of the waveguide.

In one illustrative embodiment, the waveguide forms a defined angle with the substrate and the defined angle between nanowire and substrate is selected to create a vertical or close to vertical orientation.

In one illustrative embodiment, the waveguide is provided with at least one cladding layer.

In one illustrative embodiment, the one cladding layer is an optical cladding layer configured to enhance wave-guiding properties of the waveguide.

In one illustrative embodiment, a plurality of cladding layers provide a graded refractive index towards a boundary of the waveguide to enhance wave-guiding properties of the waveguide.

In one illustrative embodiment, the cladding layer comprises a metal to create electrical connection, and/or reduce the cross talk between the adjacent pixels.

In one illustrative embodiment, a diameter of the waveguide is larger than $\lambda/2n_w$, wherein, $\lambda$ is the wavelength of the confined light and $n_w$ is the refractive index of the waveguide.

In one illustrative embodiment, the active region is arranged within the nanowire.

In one illustrative embodiment, the pn junction associated with the active region is formed by doping the silicon nanowire.

In one illustrative embodiment, the nanowire is arranged to direct light in downward direction towards the substrate.

The waveguide can further comprise, for example, a planar photodetector and a plurality of nanowires arranged in an upstanding configuration on the planar photodetector surface and in epitaxial connection with the planar photodetector layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
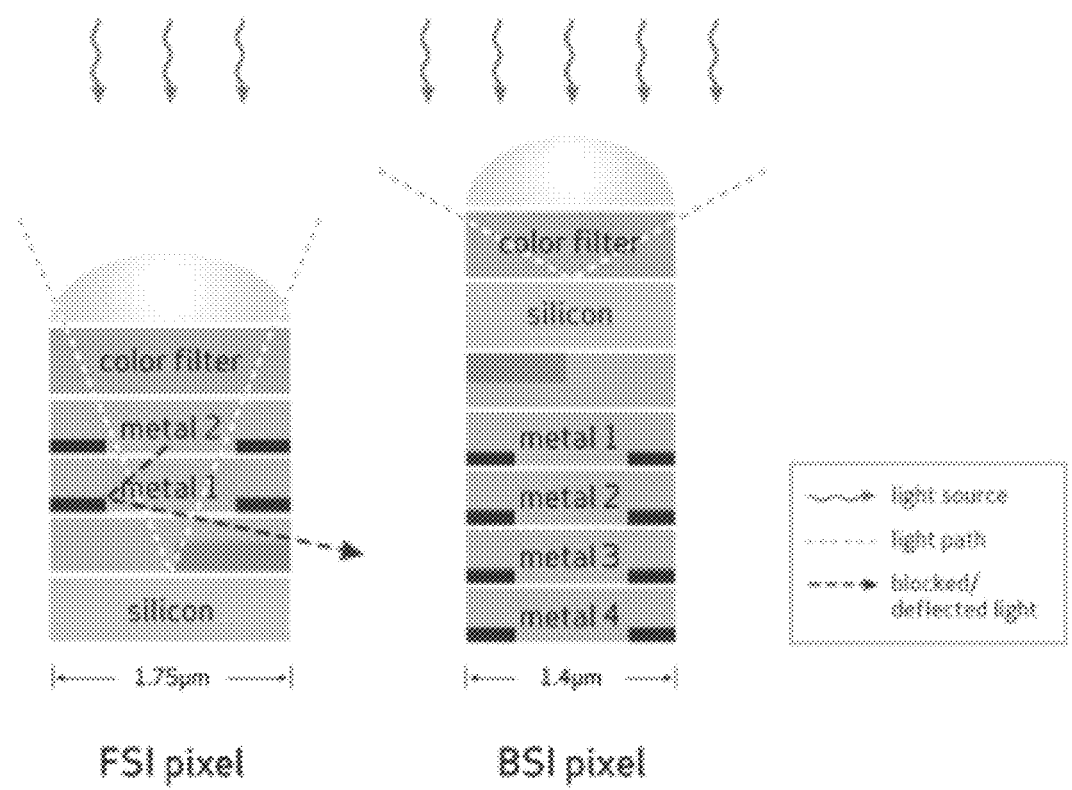
FIG. 1 shows an illustrative embodiment of a cross sectional view of a conventional front illumination sensor and a back-illuminated sensor.

Symbols for elements illustrated in the figures are summarized in the following table. The elements are described in more detail below.

| Symbol | Element |
| --- | --- |
| VPG 1 (Vp Gate 1) | The first vertical photogate |
| VPG 2 (Vp Gate 2) | The second vertical photogate |
| TX Gate | Transfer gate |
| FD | Transfer drain |
| RG | Reset gate |
| RD | Reset drain |
| Sub | Substrate |
| VDD | Positive transistor voltage |
| Vout | Output voltage |
| NW (nw) | Nanowire |
| De | Dielectric layer |
| PG | Photogate |
| I (i) | Current |
| n+, n− | Semiconducting material with excess donors, n+ is heavily doped, n− is lightly doped |
| p+, p− | Semiconducting material with excess acceptors, p+ is heavily doped, p− is lightly doped |

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

The term nanowire refers to a structure that has a thickness or diameter of the order of nanometers, for example, 100 nanometers or less and an unconstrained length. Nanowires can include metallic (e.g., Ni, Pt, Au), semiconducting (e.g., Si, Inp, Gan, etc.), and insulating (e.g., $SiO_2$, $TiO_2$) materials. Molecular nanowires are composed of repeating molecular units either organic or inorganic. Nanowires can exhibit aspect ratios (length-to-width ratio) of 1000 or more. As such they can be referred to as 1-dimensional (1D) materials. Nanowires can have many interesting properties that are not seen in bulk or 3-D materials. This is because electrons in nanowires can be quantum confined laterally and thus occupy energy levels that can be different from the traditional continuum of energy levels or bands found in bulk materials. As a result, nanowires can have discrete values of electrical and optical conductance. Examples of nanowires include inorganic molecular nanowires ($Mo_6S_{9-x}I_x$, $Li_2Mo_6Se_6$), which can have a diameter of the range of few nanometers, and can be hundreds of micrometers long. Other important examples are based on semiconductors such as Inp, Si, Gan, etc., dielectrics (e.g. $SiO_2$, $TiO_2$), or metals (e.g. Ni, Pt).

The term excitons refer to electron-hole pairs.

An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and even diodes are all considered passive elements. Active elements include in embodiments disclosed herein, but are not limited to, an active waveguide, transistors, silicon-controlled rectifiers (SCRs), light emitting diodes, and photodiodes.

A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide can be considered to be "active" and within the genus of an active element.

An optical pipe is an element to confine and transmit an electromagnetic radiation that impinges on the optical pipe. The optical pipe can include a core and a cladding. The core can be a nanowire. The optical pipe can be configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core. A core and a cladding are generally complimentary components of the optical pipe and are configured to separate wavelengths of an electromagnetic radiation beam incident on the optical pipe at a selective wavelength through the core and cladding.

A photogate is a gate used in an optoelectronic device. Typically the photogate comprises a metal-oxide-semiconductor (MOS) structure. The photogate accumulates photo generated charges during the integration time of the photodiode and controls the transfer of charges when integration is over. A photodiode comprises a pn junction, however, a photogate can be placed on any type semiconductor material. A vertical photogate is a new structure. Normally, photogates are placed on a planar photodiode devices. In a nanowire device, however, the photogate can be formed in a vertical direction. That is, standing up covering the lateral surface of the nanowire.

A transfer gate is a gate of a switch transistor used in a pixel. The transfer gate's role is to transfer the charges from one side of a device to another. In some embodiments, the transfer gate is used to transfer the charges from the photodiode to the sensing node (or floating diffusion). A reset gate is a gate used for resetting a device. In some embodiments, the device is the sense node which is formed by an n+ region. Reset means to restore to original voltage level set by a certain voltage. In some embodiments, the voltage of the reset drain (RD) is the voltage used as a reset level.

A floating capacitor is a capacitor which floats relative to the substrate. Normally a capacitor consists of two electrodes and an insulator between them. Typically, both of the electrodes are connected to other device or signal lines. In a pixel, often one of the electrodes may not be connected to a structure. This unconnected, isolated area forms the floating capacitor with respect to the substrate. In other words, the isolated area comprises one electrode which is floating. The substrate comprises the other electrode which is normally connected to the ground. A depletion region between them comprises the insulator.

A global connection is a connection in which many branch nodes are connected to a single line electrically so that one signal line can control the multiple branched devices at the same time. A source-follower amplifier is a common drain transistor amplifier. That is, a transistor amplifier whose source node follows the same phase as the gate node. The gate terminal of the transistor serves as the input, the source is the output, and the drain is common to both (input and output). A shallow layer is a doped layer that is physically located near the surface of the substrate. For example, a p+ layer may be intentionally formed shallow by using low energy when ion implantation is used. Normally the junction depth of a shallow layer is 0.01 µm~0.2 µm. In contrast, a deep layer may be as deep as a few µm to tens of µm.

An intrinsic semiconductor, also called an undoped semiconductor or i-type semiconductor, is a pure semiconductor without any significant dopant species present. The number of charge carriers is therefore determined by the properties of the material itself instead of the amount of impurities. In intrinsic semiconductors, the number of excited electrons and the number of holes are equal: n=p. The conductivity of intrinsic semiconductors can be due to crystal defects or to thermal excitation. In an intrinsic semiconductor, the number of electrons in the conduction band is equal to the number of holes in the valence band.

Shallow trench isolation (STI), also known as 'Box Isolation Technique', is an integrated circuit feature which prevents electrical current leakage between adjacent semiconductor device components. STI is generally used on CMOS process technology nodes of 250 nanometers and smaller. Older CMOS technologies and non-MOS technologies commonly use isolation based on LOCal Oxidation of Silicon (LOCOS). STI is typically created early during the semiconductor device fabrication process, before transistors are formed. Steps of the STI process include etching a pattern of trenches in the silicon, depositing one or more dielectric materials (such as silicon dioxide) to fill the trenches, and removing the excess dielectric using a technique such as chemical-mechanical planarization.

In yet other embodiments, a plurality of nanowires are arranged on a regular tessellation.

In yet other embodiments, a coupler that may take the shape of a micro lens efficiently can be located on the optical pipe to collect and guide the electromagnetic radiation into the optical pipe. The optical pipe can comprise of a nanowire core of refractive index $n_1$ surrounded by a cladding of refractive index $n_2$.

In the configuration of the optical pipe of the embodiments of this invention, it is possible to eliminate pigmented color filters that absorb about ⅔ of the light that impinges on the image sensor. The core functions as an active waveguide and the cladding of the optical pipe can function as a passive waveguide with a peripheral photosensitive element surrounding the core to detect the electromagnetic radiation transmitted through the passive waveguide of the cladding. Passive waveguides do not absorb light like color filters, but can be designed to selectively transmit selected wavelengths.

A waveguide, whether passive or active, has a cutoff wavelength that is the lowest frequency that the waveguide can propagate. The diameter of the semiconductor nanowire of the core serves as the control parameter for the cutoff wavelength of the nanowire.

The nanowire can also serve as a photodiode by absorbing the confined light and generating electron-hole pairs (excitons).
Excitons so generated can be detected by using at least one of the following two designs:
(1) A core is made up of a three layers, semiconductor, insulator and metal thus forming a capacitor to collect the charge generated by the light induced carriers. Contacts are made to the metal and to the semiconductor to control and detect the stored charge. The core can be formed by growing a nanowire and depositing an insulator layer and a metal layer surrounding the nanowire.
(2) A core having a pin junction that induces a potential gradient in the core wire. The pin junction in the core can be formed by growing a nanowire and doping the nanowire core while it is growing as a pin junction and contacting it at the appropriate points using the various metal layers that are part of any device. ITO also can be used as a electrically conductive material.

The photosensitive elements of the embodiments typically comprise a photodiode, although not limited to only a photodiode. Typically, the photodiode is doped to a concentration from about $1 \times 10^{16}$ to about $1 \times 10^{18}$ dopant atoms per cubic centimeter, with an appropriate dopant.

The image sensor can have different stacking layers. The stacking layers can comprise dielectric material-containing and metal-containing layers. The dielectric materials include as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

The dielectric material-containing layers may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods.

The metal-containing layers can function as electrodes. Non-limiting examples include certain metals, metal alloys, metal silicides and metal nitrides, as well as doped polysilicon materials (i.e., having a dopant concentration from about $1 \times 10^{18}$ to about $1 \times 10^{22}$ dopant atoms per cubic centimeter) and polycide (i.e., doped polysilicon/metal silicide stack) materials. The metal-containing layers may be deposited using any of several methods. Non-limiting examples include chemical vapor deposition methods (also including atomic layer chemical vapor deposition methods) and physical vapor deposition methods. The metal-containing layers can comprise a doped polysilicon material (having a thickness typically in the range 1000 to 1500 Angstroms.

The dielectric and metallization stack layer comprises a series of dielectric passivation layers. Also embedded within the stack layer are interconnected metallization layers. Components for the pair of interconnected metallization layers include, but are not limited to contact studs, interconnection layers, interconnection studs.

The individual metallization interconnection studs and metallization interconnection layers that can be used within the interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials.

The series of dielectric passivation layers may also comprise any of several dielectric materials that are conventional in the semiconductor fabrication art. Included are generally higher dielectric constant dielectric materials having a dielectric constant from 4 to about 20. Non-limiting examples that are included within this group are oxides, nitrides and oxynitrides of silicon. For example, the series of dielectric layers may also comprise generally lower dielectric constant dielectric materials having a dielectric constant from about 2 to about 4. Included but not limiting within this group are hydrogels such as silicon hydrogel, aerogels like silicon Al, or carbon aerogel, silsesquioxane spin-on-glass dielectric materials, fluorinated glass materials, organic polymer materials, and other low dielectric constant materials such as doped silicon dioxide (e.g., doped with carbon, fluorine), and porous silicon dioxide.

The dielectric and metallization stack layer can comprise interconnected metallization layers and discrete metallization layers comprising at least one of copper metallization materials and aluminum metallization materials. The dielectric and metallization stack layer also comprises dielectric passivation layers that also comprise at least one of the generally lower dielectric constant dielectric materials disclosed above. The dielectric and metallization stack layer can have an overall thickness from about 1 to about 4 microns. It may comprise from about 2 to about 4 discrete horizontal dielectric and metallization component layers within a stack.

The layers of the stack layer can be patterned to form patterned dielectric and metallization stack layer using methods and materials that are conventional in the semiconductor fabrication art, and appropriate to the materials from which are formed the series of dielectric passivation layers. The dielectric and metallization stack layer may not be patterned at a location that includes a metallization feature located completely therein. The dielectric and metallization stack layer may be patterned using wet chemical etch methods, dry plasma etch methods or aggregate methods thereof. Dry plasma etch methods as well as e-beam etching if the dimension needs to be small, are generally preferred insofar as they provide enhanced sidewall profile control when forming the series of patterned dielectric and metallization stack layer.

A planarizing layer may comprise any of several optically transparent planarizing materials. Non-limiting examples include spin-on-glass planarizing materials and organic polymer planarizing materials. The planarizing layer can extend above the optical pipe such that the planarizing layer can have a thickness sufficient to at least planarize the opening of the optical pipe, thus providing a planar surface for fabrication of additional structures within the CMOS image sensor. The planarizing layer can be patterned to form the patterned planarizing layer.

Optionally, there can be a series of color filter layers located upon the patterned planarizing layer. The series of color filter layers, if present, would typically include either the primary colors of red, green and blue, or the complementary colors of yellow, cyan and magenta. The series of color filter layers would typically comprise a series of dyed or pigmented patterned photoresist layers that are intrinsically imaged to form the series of color filter layers. Alternatively, the series of color filter layers may comprise dyed or pigmented organic polymer materials that are otherwise optically transparent, but extrinsically imaged while using an appropriate mask layer. Alternative color filter materials may also be used. The filter can also be filter for a black and white, or IR sensors wherein the filter cuts off visible and pass IR predominantly.

The spacer layer can be one or more layers made of any material that physically, but not optically, separates the stacking layers from a micro lens on the top of the optical pipe near the incident electromagnetic radiation beam receiving end of the image sensor. The function of the micro lens or in more general terms is to be a coupler, i.e., to couple the incident electromagnetic radiation beam into the optical pipe. If one were to choose a micro lens as the coupler in this embodiment, its distance from the optical pipe would be much shorter than to the photosensitive element, so the constraints on its curvature are much less stringent, thereby making it implementable with existing fabrication technology. The spacer layer can be formed of a dielectric spacer material or a laminate of dielectric spacer materials, although spacer layers formed of conductive materials are also known. Oxides, nitrides and oxynitrides of silicon are commonly used as dielectric spacer materials. Oxides, nitrides and oxynitrides of other elements such as ITO (Indium tin oxide) are not excluded. The dielectric spacer materials may be deposited using methods analogous, equivalent or identical to the methods described above. The spacer layer can be formed using a blanket layer deposition and etchback method that provides the spacer layer with the characteristic inward pointed shape.

The micro lens may comprise any of several optically transparent lens materials that are known in the art. Non-limiting examples include optically transparent inorganic materials, optically transparent organic materials and optically transparent composite materials. Most common are the optically transparent organic materials. Typically the lens layers can be formed incident to patterning and reflow of an organic polymer material that has a glass transition temperature lower than the series of color filter layers, if present, or the patterned planarizing layer.

In the optical pipe, the high index material in the core can, for example, be silicon nitride having a refractive index of about 2.0. The lower index cladding layer material can, for example, be a glass, for example a material selected from Table i, having a refractive index about 1.5. The core can be Silicon having refractive index in the range 5-6, and the cladding can be silicon oxide having a refractive index of about 1.5.

In the optical pipe, the high index material in the core can, be surrounded by a cladding having two or more cladding have different materials of consecutively lesser index of refraction. For example, if silicon is the material of the core, a first layer of silicon nitride can be used, followed by another layer of silicon oxides. In this configuration, the indices are reduced from 5-6 in the core to about 2 in the first layer and then to about 1.5 in the second cladding layer.

In this embodiment, the two or more concentric dielectric layers perform a light guiding function. Thus, one aspect of this embodiment is the absence of a metal layer. In another aspect, the successive concentric dielectric layers of the two or more concentric dielectric layers have a lower index of refraction with increasing radius. That is, concentric dielectric layers with a larger radius have a lower index of refraction than concentric dielectric layers having a smaller radius. In another aspect, adjacent concentric dielectric layers have alternating higher and lower indexes of refraction.

In one embodiment, the waveguiding nanowire structure includes a high refractive index core with one or more surrounding cladding with refractive indexes less than that of the core. The structure has either a circular symmetry, or close to being of circular symmetry. The materials of the different members of the nanostructured wire are such that the nanowire will have good waveguiding properties with respect to the surrounding materials, i.e. the refractive index of the material in the nanowire should be larger than the refractive indices of the surrounding materials. If the nanowire has a first refracting index, $n_w$, the material surrounding the nanowire typically cover one or more layer graded refractive index, for example, $n_3 < n_2 < n_1 < n_w$.

TABLE I

| Typical Material Index of Refraction | |
|---|---|
| Micro Lens (Polymer) | 1.583 |
| Spacer | 1.512 |
| Color Filter | 1.541 |
| Planarization | 1.512 |
| PESiN | 2.00 |
| PESiO | 1.46 |
| SiO | 1.46 |

In Table I, PESin refers to plasma enhanced Sin and PESiO refers to plasma enhanced SiO.

The shape of the optical pipe can be different for different embodiments. In one configuration, the optical pipe can be cylindrical, that is, the diameter of the pipe remains the substantially the same throughout the length of the optical pipe. In another configuration, the optical pipe can be conical, where the upper diameter of the cross sectional area of the optical pipe can be greater or smaller than the lower diameter of the cross sectional area of the optical pipe. The terms "upper" and "lower" refer to the ends of the optical pipe located closer to the incident electromagnetic radiation beam receiving and exiting ends of the image sensor. Other shapes include a stack of conical sections.

Table I lists several different glasses and their refractive indices. These glasses can be used for the manufacture of the optical pipe such that refractive index of the core is higher than that of the cladding. The image sensors of the embodiments can be fabricated using different transparent glasses having different refractive indices without the use of pigmented color filters.

By nesting optical pipes that function as waveguides and using a micro lens coupler, an array of image sensors can be configured to obtain complementary colors having wavelengths of electromagnetic radiation separated at a cutoff wavelength in the core and cladding of each optical pipe of every image sensor. The complementary colors are generally two colors which when mixed in the proper proportion produce a neutral color (grey), white, or black. This configuration also enables the capture and guiding of most of the electromagnetic radiation incident beam impinging on the micro lens to the photosensitive elements (i.e., photodiodes) located at the lower end of the optical pipe. Two adjacent or substantially adjacent image sensors with different color complementary separation can provide complete information to reconstruct a full color scene according to embodiments described herein. This technology of embodiments disclosed herein can further supplant pigment based color reconstruction for image sensing which suffers from the inefficiency of discarding (through absorption) the non-selected color for each pixel.

Each physical pixel of a device containing an image sensor of the embodiments disclosed herein can have two outputs representing the complementary colors, e.g., cyan designated as output type 1 and yellow designated as output type 2. These outputs would be arranged in tessellations as follows:

```
1 2 1 2 1 2 1 2 1 2 1 2 1 2 1 2 ...
2 1 2 1 2 1 2 1 2 1 2 1 2 1 2 1 ...
1 2 1 2 1 2 1 2 1 2 1 2 1 2 1 2 ...
... ... ... ... ... ... ... ... ... ... ... ... ... ... ... ...
... ... ... ... ... ... ... ... ... ... ... ... ... ...
```

Each physical pixel can have complete luminance information obtained by combining its two complementary outputs. The two complementary outputs can be measured by the photodiode in the optical pipe and by one or more photodiodes in the substrate. As a result, the same image sensor can be used either as a full resolution black and white or full color sensor.

In the embodiments of the image sensors disclosed herein, the full spectrum of wavelengths of the incident electromagnetic radiation beam (e.g., the full color information of the incident light) can be obtained by the appropriate combination of two adjacent pixels either horizontally or vertically as opposed to 4 pixels for the conventional Bayer pattern.

Depending on the minimum transistor sizes, each pixel containing an image sensor of the embodiments disclosed herein can be as small as 1 micron or less in pitch and yet have sufficient sensitivity. This can open the way for contact imaging of small structures such as biological systems.

The embodiments, which include a plurality of embodiments of an image sensor, as well as methods for fabrication thereof, will be described in further detail within the context of the following description. The description is further understood within the context of the drawings described above. The drawings are for illustrative purposes and as such are not necessarily drawn to scale.

An embodiment of a compound pixel comprises a system of two pixels, each having a core of a different diameter such that cores have diameters $d_1$ and $d_2$ for directing light of different wavelengths (for example, $\lambda_G$, $\lambda_B$ or $\lambda_R$). The two cores can also serve as photodiodes to capture light of wavelengths $\lambda_B$, $\lambda_G$, or $\lambda_R$. The claddings of the two image sensors serve for transmitting the light of wave length $\lambda_{w-B}$, $\lambda_{w-G}$ or $\lambda_{w-R}$. The light of wave length $\lambda_{w-B}$, $\lambda_{w-G}$ or $\lambda_{w-R}$ transmitted through the cladding is detected by the peripheral photosensitive elements surrounding the cores. Note that (w) refers to the spectrum of white light. Signals from the 4 photodiodes (two located in the cores and two located in or on the substrate surrounding the core) in the compound pixel are used to construct color.

The embodiments include a nanostructured photodiode (PD) according to the embodiments comprise a substrate and an upstanding nanowire protruding from the substrate.

A pn-junction giving an active region to detect light may be present within the structure. The nanowire, a part of the nanowire, or a structure in connection with the nanowire, forms a waveguide directing and detecting at least a portion of the light that impinges on the device. In addition the waveguide doubles up as spectral filter that enables the determination of the color range of the impinging light.

A nanostructured PD according to the embodiments comprises of an upstanding nanowire. For the purpose of this application an upstanding nanowire should be interpreted as a nanowire protruding from the substrate in some angle, the upstanding nanowire for example being grown epitaxially from the substrate, for example, by as vapor-liquid-solid (VLS) grown nanowires. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. Semiconductor nanowires can be grown normal to the substrate, and silicon nanowires can be grown in the [111] directions with substrate in the (111) crystal plan. Nanowires and substrates of zinc-blende and diamond semiconductors composed of elements from columns IIi, V and IV of the periodic table, such nanowires can be grown in the directions and then be grown in the normal direction to any {111} substrate surface. Other directions given as the angle between normal to the surface and the axial direction of the nanowire include 70,53° {111}, 54,73° {100}, and 35,27° and 90°, both to {110}. Thus, the nanowires define one, or a limited set, of directions.

According to the embodiments, a part of the nanowire or structure formed from the nanowire can be used as a waveguide directing and confining at least a portion of the light impinging on the nanostructured PD in a direction given by the upstanding nanowire. The waveguiding nanostructured PD structure can include a high refractive index core with one or more surrounding cladding(s) with refractive indices less than that of the core. The structure can be either circular symmetrical or close to being circular symmetrical. Light waveguiding in circular symmetrical structures are well know for fiber-optic applications and many parallels can be made to the area of rare-earth-doped fiber optic devices. However, one difference is that fiber amplifier are optically pumped to enhance the light guided through them while the described nanostructured PD can be seen as an efficient light to electricity converter. One well known figure of merit is the so called Numerical Aperture, NA. The NA determines the angle of light captured by the waveguide. The NA and the angle of the captured light are important parameters in the optimization of a new PD structure.

For a PD operating in IR and above IR, using GaAs can be good, but for a PD operating in the visible light region, silicon would be preferable. For example to create circuits, Si and doped Si materials are preferable. Similarly, for a PD working in the visible range of light, one would prefer to use Si.

In one embodiment, the typical values of the refractive indexes for III-V semiconductor core material are in the range from 2.5 to 5.5 when combined with glass type of cladding material (such as $SiO_2$ or $Si_3N_4$) having refractive indexes ranging from 1.4 to 2.3. A larger angle of capture means light impinging at larger angles can be coupled into the waveguide for better capture efficiency.

One consideration in the optimization of light capture is to provide a coupler into the nanowire structure to optimize light capture into the structure. In general, it would be preferred to have the NA be highest where the light collection takes place. This would maximize the light captured and guided into the PD.

A nanostructured PD according to the embodiments can comprise a substrate and a nanowire epitaxially grown from the substrate in an defined angle θ. A portion of or all of the nanowire can be arranged to act as a waveguiding portion directing at least a portion of the impinging light in a direction given by the elongated direction of the nanowire, and will be referred to as a waveguide. In one possible implementation, a pn-junction necessary for the diode functionality can be formed by varying the doping of the wire along its length while it is growing. Two contacts can be provided on the nanowire for example one on top or in a wrapping configuration on the circumferential outer surface and the other contact can be provided in the substrate. The substrate and part of the upstanding structure may be covered by a cover layer, for example as a thin film as illustrated or as material filling the space surrounding the nanostructured PD.

The nanowire can have a diameter in the order of 50 nm to 500 nm, The length of the nanowire can be of the order of 1 to 10 µm. The length of the nanowire is preferably of the order of 4-10 µm, providing enough volume for creating an active pn junction. The pn-junction results in an active region arranged in the nanowire. Impinging photons in the nanowire are converted to electron hole pairs and in one implementation are subsequently separated by the electric fields generated by the PN junction along the length of the nanowire. The materials of the different members of the nanostructured PD are chosen so that the nanowire will have good waveguiding properties vis-a-vis the surrounding materials, i.e. the refractive index of the material in the nanowire should preferably be larger than the refractive indices of the surrounding materials.

In addition, the nanowire may be provided with one or more layers. A first layer, may be introduced to improve the surface properties (i.e., reduce charge leakage) of the nanowire. Further layers, for example an optical layer may be introduced specifically to improve the waveguiding properties of the nanowire, in manners similar to what is well established in the area of fiber optics. The optical layer typically has a refractive index in between the refractive index of the nanowire and the surrounding cladding region material. Alternatively the intermediate layer has a graded refractive index, which has been shown to improve light transmission in certain cases. If an optical layer is utilized the refractive index of the nanowire, $n_w$, should define an effective refractive index for both the nanowire and the layers.

The ability to grow nanowires with well defined diameters, as described above and exemplified below, can be used to optimize the waveguiding properties of the nanowire or at least the waveguide with regards to the wavelength of the light confined and converted by the nanostructured PD. The diameter of the nanowire can be chosen so as to have a favorable correspondence to the wavelength of the desired light. Preferably the dimensions of the nanowire are such that a uniform optical cavity, optimized for the specific wavelength of the produced light, is provided along the nanowire. The core nanowire must be sufficiently wide to capture the desired light. A rule of thumb would be that the diameter must be larger than $\lambda/2n_w$, wherein $\lambda$ is the wavelength of the desired light and $n_w$ is the refractive index of the nanowire. As an example a diameter of about 60 nm may be appropriate to confine blue light only and one 80 nm may be appropriate for to confine both blue and green light only in a silicon nanowire.

In the infra-red and near infra-red a diameter above 100 nm would be sufficient. An approximate preferred upper limit for the diameter of the nanowire is given by the growth constraints, and can be of the order of 500 nm. The length of the nanowire is typically and preferably of the order of 1-10 µm, providing enough volume for the light conversion region.

A reflective layer can be in one embodiment, provided on the substrate and extending under the wire. The purpose of the reflective layer is to reflect light that is guided by the wire but has not been absorbed and converted to carriers in the nanostructured PD. The reflective layer is preferably provided in the form of a multilayered structure comprising repeated layers of silicates for example, or as a metal film. If the diameter of the nanowire is sufficiently smaller than the wavelength of the light a large fraction of the directed light mode will extend outside the waveguide, enabling efficient reflection by a reflective layer surrounding the narrow the nanowire waveguide An alternative approach to getting a reflection in the lower end of the waveguide core can be to arrange a reflective layer in the substrate underneath the nanowire. Yet another alternative can be to introduce reflective means within the waveguide. Such reflective means can be a multilayered structure provided during the growth process of the nanowire, the multilayered structure comprising repeated layers of for example $SiN_x/SiO_x$ (dielectric).

To form the pn-junction necessary for light detection at least part of the nanostructure is preferably doped. This can be done by either changing dopants during the growth of the nanowire or using a radial shallow implant method on the nanowire once it is grown.

Considering systems where nanowire growth is locally enhanced by a substance, as vapor-liquid-solid (VLS) grown nanowires, the ability to change between radial and axial growth by altering growth conditions enables the procedure (nanowire growth, mask formation, and subsequent selective growth) to be repeated to form nanowire/3D-sequences of higher order. For systems where nanowire axial growth and selective radial growth are not distinguished by separate growth conditions it may be better to first grow the nanowire along the length and by different selective growth steps grow different types of 3D regions.

A fabrication method according to the embodiments of a light detecting pn-diode/array with active nanowire region(s) formed of Si, comprises the steps of:

1. Defining of local catalyst/catalysts on a silicon substrate by lithography.
2. Growing silicon nanowire from local catalyst. The growth parameters adjusted for catalytic wire growth.
3. Radial growing of other semiconductor, passivation, thin insulator or metal concentric layer around the nanowire (cladding layer).
4. Forming contacts on the PD nanowire and to the substrate and to other metal layers in a CMOS circuit.

The growth process can be varied in known ways, for example, to include heterostructures in the nanowires, provide reflective layers etc.

Depending on the intended use of the nanostructured PD, availability of suitable production processes, costs for materials etc., a wide range of materials can be used for the different parts of the structure. In addition, the nanowire based technology allows for defect free combinations of materials that otherwise would be impossible to combine. The III-V semiconductors are of particular interest due to their properties facilitating high speed and low power electronics. Suitable materials for the substrate include, but is not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe. Suitable materials for the nanowire 110 include, but is not limited to: Si, GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb. Possible donor dopants for e.g. GaP, Te, Se, S, etc, and acceptor dopants for the same material are Zn, Fe, Mg, Be, Cd, etc. It should be noted that the nanowire technology makes it possible to use nitrides such as SiN, GaN, InN and AN, which facilitates fabrication of PDs detecting light in wavelength regions not easily accessible by conventional techniques. Other combinations of particular commercial interest include, but is not limited to GaAs, GaInP, GaAlInP, GaP systems. Typical doping levels range from $10^{18}$ to $10^{20}$ per cubic centimeter. A person skilled in the art is thoroughly familiar with these and other materials and realizes that other materials and material combinations are possible.

The appropriateness of low resistivity contact materials are dependent on the material to be deposited on, but metal, metal alloys as well as non-metal compounds like Al, Al—Si, $TiSi_2$, Tin, W, ITO (InSnO), MoSi2, PtSi, CoSi2, WSi2, In, AuGa, AuSb, AuGe, PeGe, Ti/Pt/Au, Ti/Al/Ti/Au, Pd/Au, etc. and combinations of e.g. metal and ITO can be used.

The substrate can be an integral part of the device, since it also contains the photodiodes necessary to detect light that has not been confined to the nanowire. The substrate in addition also contains standard CMOS circuits to control the biasing, amplification and readout of the PD as well as any other CMOS circuit deemed necessary and useful. The substrate include substrates having active devices therein. Suitable materials for the substrates include silicon and silicon-containing materials. Generally, each sensor element of the embodiments include a nanostructured PD structure comprise a nanowire, a cladding enclosing at least a portion of the nanowire, a coupler and two contacts.

The fabrication of the nanostructured PDs on silicon is possible to the degree that the nanowires are uniformly aligned in the (111) direction normal to the substrates and essentially no nanowires are grown in the three declined (111) directions that also extends out from the substrate. The well aligned growth of III-V nanowires in predefined array structures on silicon substrates, is preferred for successful large scale fabrication of optical devices, as well as most other applications.

PD devices build on silicon nanowires are of high commercial interest due to their ability to detect light of selected wavelengths not possible with other material combinations. In addition they allow the design of a compound photodiode that allows the detection of most of the light that impinges on an image sensor.

EXAMPLES

Example 1

Figure 2:
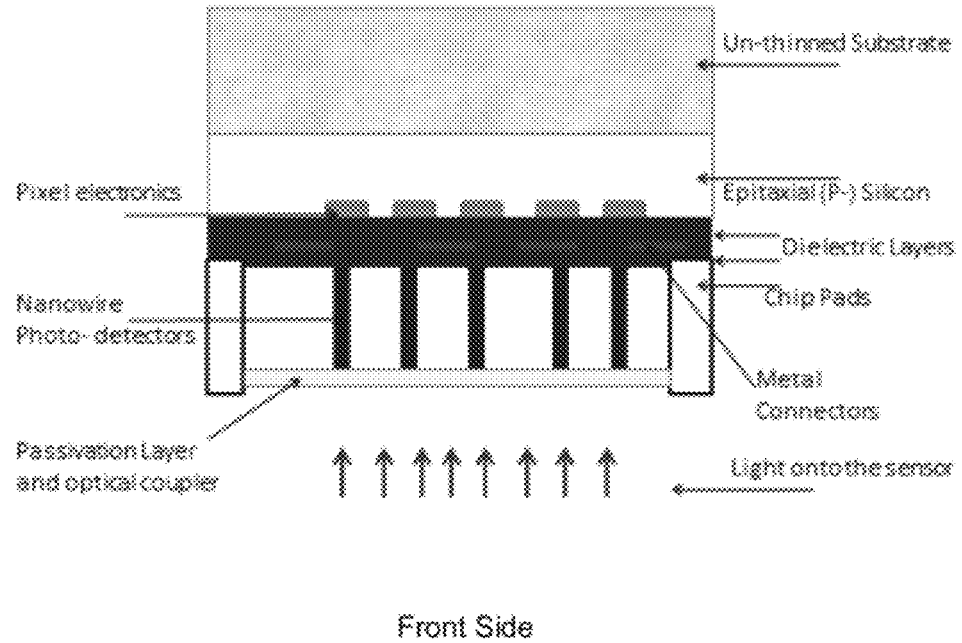
FIG. 2 shows an illustrative embodiment of a cross-sectional view of a back-illuminated image sensor.

An example of a back-side illuminated image sensor having a fully processed wafer containing a substrate photodiode but without the nanowires on the back-side of the substrate is shown in FIG. 2.

Figure 3A:
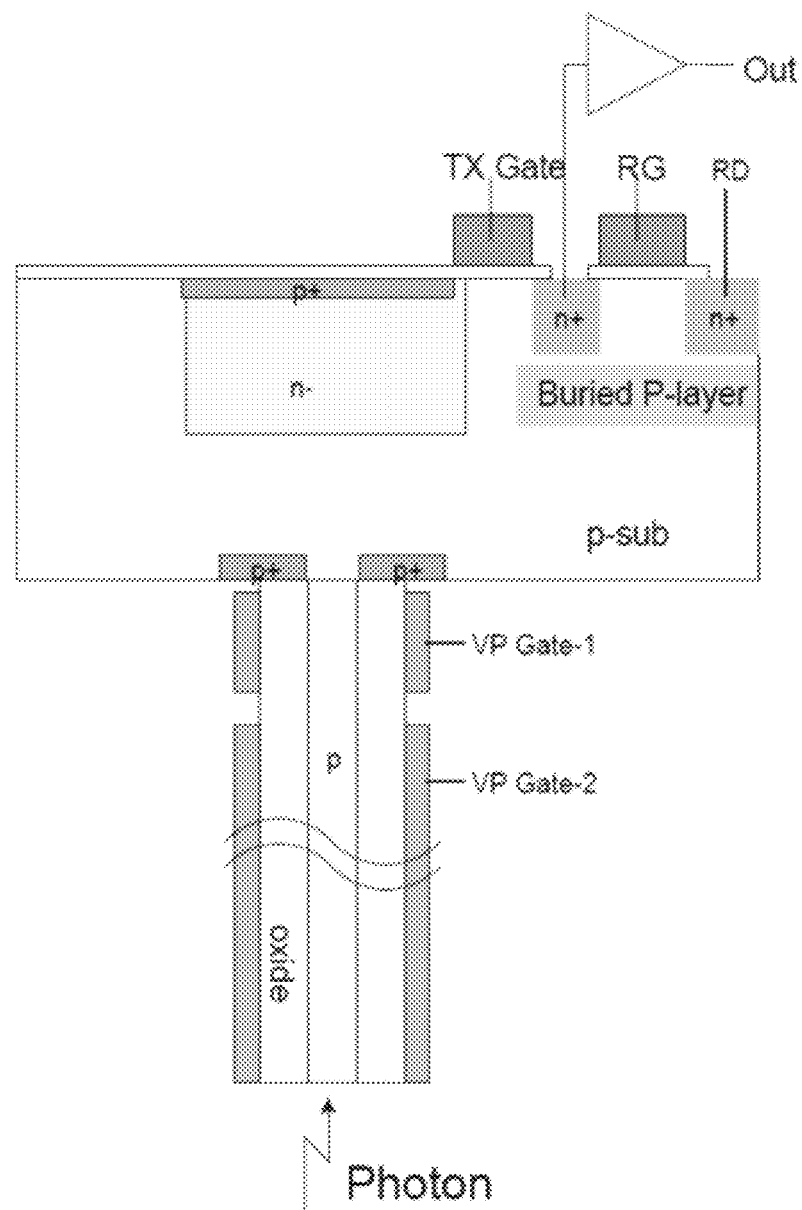
FIG. 3A shows an illustrative embodiment of a cross-sectional view of a pixel structure with a backside waveguide structure, such as a nanowire and dual vertical photogates.

FIG. 3A shows an embodiment showing a nanowire on the back-side of a fully processed wafer containing a substrate photodiode (many of these nanowires would be constructed in a close packed manner). In an embodiment such as that shown in FIG. 3A, the nanowire photodiode sensors can include one or more vertical photogates. Vertical photogates have many advantages. They can modify and control the potential profile in the semiconductor without using a complicated ion implantation process. The conventional photogate pixel suffers from poor quantum efficiency and poor blue response. The conventional photogate is normally made of polysilicon which absorbs short wavelengths near blue light, thus reducing the blue light reaching the photodiode. Further, the conventional photogate pixel is placed on top of the photodiode and may block the light path. The vertical photogate (VPG) structure, in contrast, does not block the light path. This is because the vertical photogate (VPG) does not lie laterally across the photodiode to control the potential profile in the semiconductor.

Additionally, as the pixel size of image sensors scale down, the aperture size of the image sensor becomes comparable to the wavelength. For a conventional planar type photodiode, this results in a poor quantum efficiency (QE). The combination of a VPG structure with a nanowire sensor, however, allows for an ultra small pixel with good quantum efficiency.

In one embodiment such as that shown in FIG. 3A, a nanowire pixel can have a dual vertical photogate structure. This embodiment can include two photodiodes, a nanowire photodiode and a substrate photodiode. This embodiment also includes two vertical photogates (Vp Gate 1, Vp Gate 2), a transfer gate (TX) and a reset gate (RG). Preferably, both of the photodiodes are lightly doped. This is because a lightly doped region can be easily depleted with a low bias voltage. As illustrated, both of the photodiodes are (n−). Alternatively, however, the nanowire pixel can be configured so that both photodiodes are (p−).

The surface region of the substrate photodiode can be prone to defects due to process induced damage that is produced during fabrication and to lattice stress associated with the growth of the nanowire. These defects serve as a source for dark current. To suppress the dark current at the surface of the (n−) photodiode, preferably, a (p+) region is fabricated on top of the n-photodiode in the substrate.

Preferably, the substrate is connected to ground, that is, zero voltage. In this embodiment the reset gate is preferably doped (n+) and is positively biased. When the transfer gate TX and reset gates are on, the (n−) region in the substrate becomes positively biased. This results in the (n−) region becoming depleted due to the reverse bias condition between the p doped substrate and (n−) region. When the transfer gate TX and reset gate RG are off, the (n−) region retains its positive bias, forming a floating capacitor with respect to the p-sub region.

The first vertical photogate Vp Gate 1 can be configured to control the potential in the nanowire so that a potential difference can be formed between the nanowire photodiode and the substrate photodiode. In this way, electrons in the nanowire can drift quickly to (n−) region of the substrate during the readout.

The second photogate Vp Gate-2 can be an on/off switch. This switch can be configured to separate the signal charges generated in the nanowire from the signal charges integrated in the substrate photodiode. Photo charges are integrated in both the nanowire and substrate photodiodes at the same time, but integrated in separate potential wells because the off-state of the second photogate Vp Gate-2 forms a potential barrier between them. In this manner the nanowire and substrate photodiodes do not get mixed together.

The nanowire photosensor of the present embodiment uses a two step process to read out the signals separately between the nanowire and substrate photodiodes. In the first step, the signal charges in the substrate photodiode are read out. Then, the (n−) region in the substrate is depleted. In the second step, the second photogate Vp Gate 2 can be first turned on. Then, signal charges in the nanowire are read out.

In a "snapshot" operation, preferably all of the second photogates Vp Gate 2 are turned on or off at the same time. The same can be true for the transfer gate TX. To accomplish this, the second photogates Vp Gate 2 are all connected with a global connection. Further, all the transfer gates TX are connected with a second global connection.

Generally, global operation of the reset gate RG should generally be avoided for practical reasons. In pixel arrays, it is a common practice to globally reset the array row by row. That is, it is, an entire array of pixels is generally not rested at the same time. If snapshot operation is not used, individual pixel operation is possible. In this case, it is not necessary to have global connections.

To make the back-side illuminated image sensor of FIG. 3A, the wafer is thinned by removing silicon over the area containing the photodiode array. For example, a doped p-substrate (p-sub) of FIG. 3A can be the thinned to a thickness between 3 and 50 microns, more preferably, between 6 and 20 microns. The substrate photodiode can now get all of its light from the back-side and not from the side where all the metal lines are as in conventional image sensors.

The nanowire can be formed at the backside of the doped (p−) substrate shown in FIG. 3A. At the front side, there can be a buffer amplifier and an (n−) diode with a (p+) layer on it as shown in FIG. 3A. The purpose of having (p+) at both sides of the substrate is to suppress the dark current. A buried p-layer can be placed underneath the (n+) diffusion layer to block the incoming charge flow from the backside and deflect the charges toward the (n−) layer. Preferably, doping of the buried p-layer is higher than that of the doped p-substrate, but not as high as that of the p+ layer. The front side photodiode is not for photo absorption, but rather for collecting the charges coming from the backside p-substrate where photo absorption takes place. The nanowire can have an oxide layer (cladding layer) surrounding the nanowire and two vertical photogates, one for the switch and the other for controlling the potential in the nanowire.

Typically, in the embodiment of FIG. 3A, it would take a two step process to read out the signal charges separately from at least some of the photo diodes. The first step would be to read out the charges from the p-sub diode. Immediately after this, by turning on the Vp gate-1, the charges from the nanowire would be read out.

Preferably, the embodiment of FIG. 3A should have a shallow p+ layer with a hole in the center so that the p+ layer may not block the carriers coming from the back-side nanowire. Also, preferably at the front side there should be the N-well or lowly doped n-layer underneath the shallow (p+) layer. The lowly doped N-well can be depleted easily. If (p+) and (n+) layers were to meet together, there can be a breakdown at low voltage similar to that of a Zener diode.

The embodiments relate to growing an array of nanowires (Si, or other III-V compounds) vertically in predetermined areas to serve as light detecting or light emitting devices. Such a structures may require other surrounding passive or active layers that may serve important purposes such as light channeling (as described in previous patent applications), electrical contacts and the like.

Figure 3B:
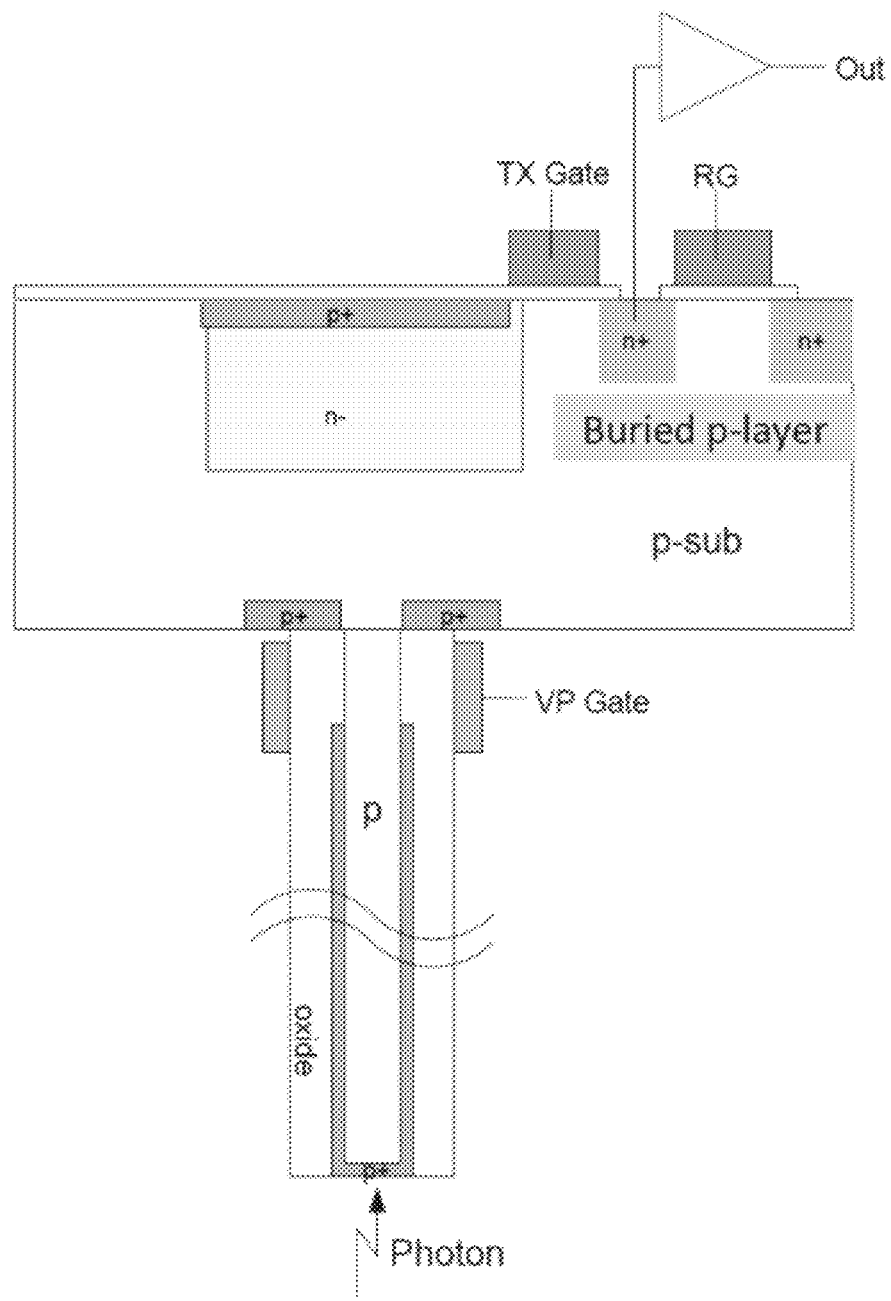
FIG. 3B shows an illustrative embodiment of a cross-sectional view of a pixel structure with a backside nanowire and a vertical gate.

FIG. 3B shows another embodiment of a back-side illuminated image sensor. In this embodiment, instead of having a vertical photogate for the nanowire, the (p+) layer can be coated at the surface of the nanowire to help create a built-in electric field in the nanowire so that electrons can drift easily in the upward direction. The features of the back-side illuminated image sensor are similar to those of the image sensor of FIG. 3A.

Figure 3C:
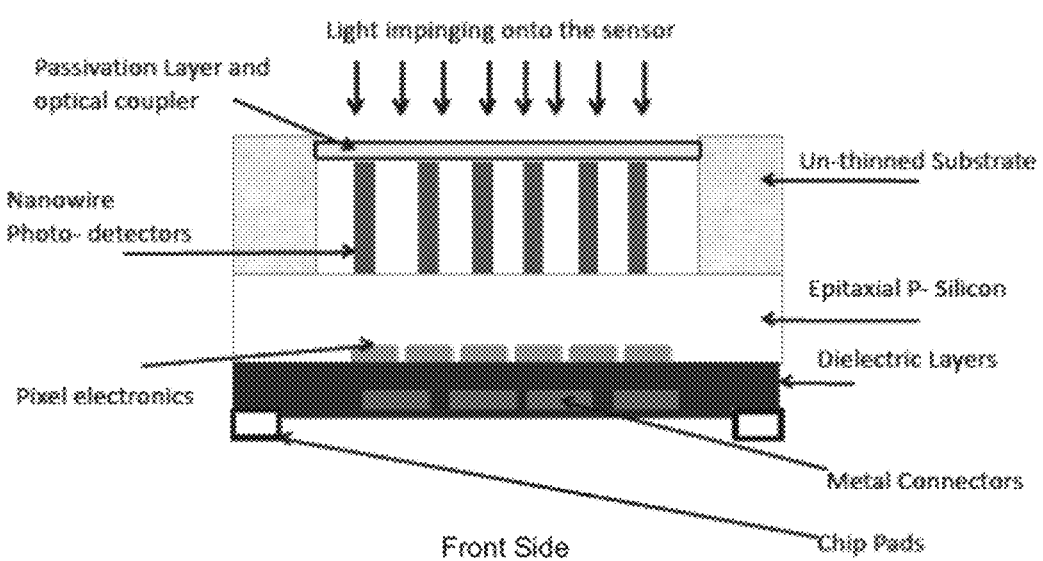
FIGS. 3C and 3D show illustrative embodiments of a cross-sectional view of a waveguide structure, such as a nanowire, containing backside-illuminated image sensor with nanowires located on the backside of the image sensor.

FIG. 3C is an embodiment showing nano-wires on the back-side of a fully processed wafer containing substrate photodiodes. In FIG. 3C, three nanowires, of different diameters are grown, and are used to select and absorb radiations of different wavelengths Red, Green and Blue.

Figure 3D:
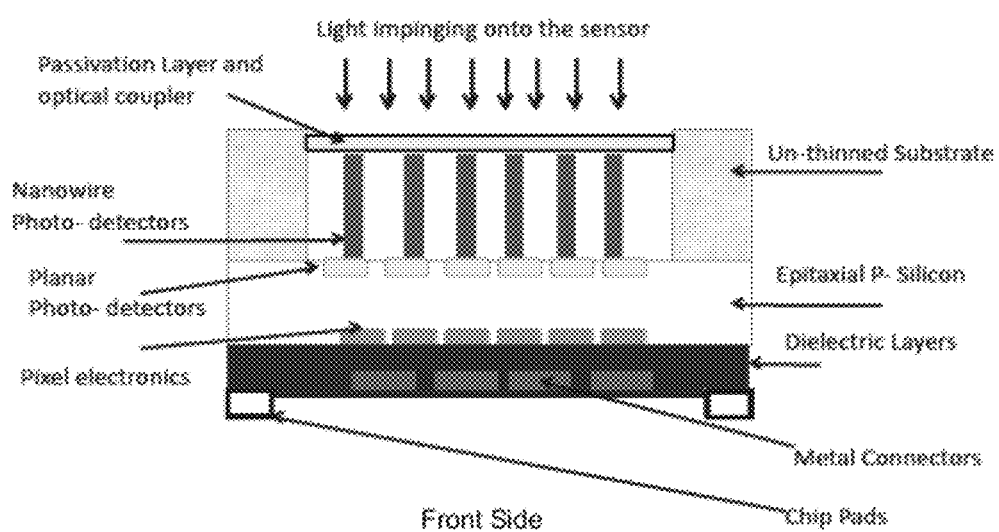

FIG. 3D is an embodiment showing nano-wires on the back-side of a fully processed wafer containing substrate photodiodes. In FIG. 3D, two nanowires, of different diameters are grown, and used to select and absorb radiation, and with every nanowire there is a planar photodiode, or more than one, built into the substrate. The planner photodiodes absorb the radiation that was not allowed to propagate in the nanowires.

Figure 4A:
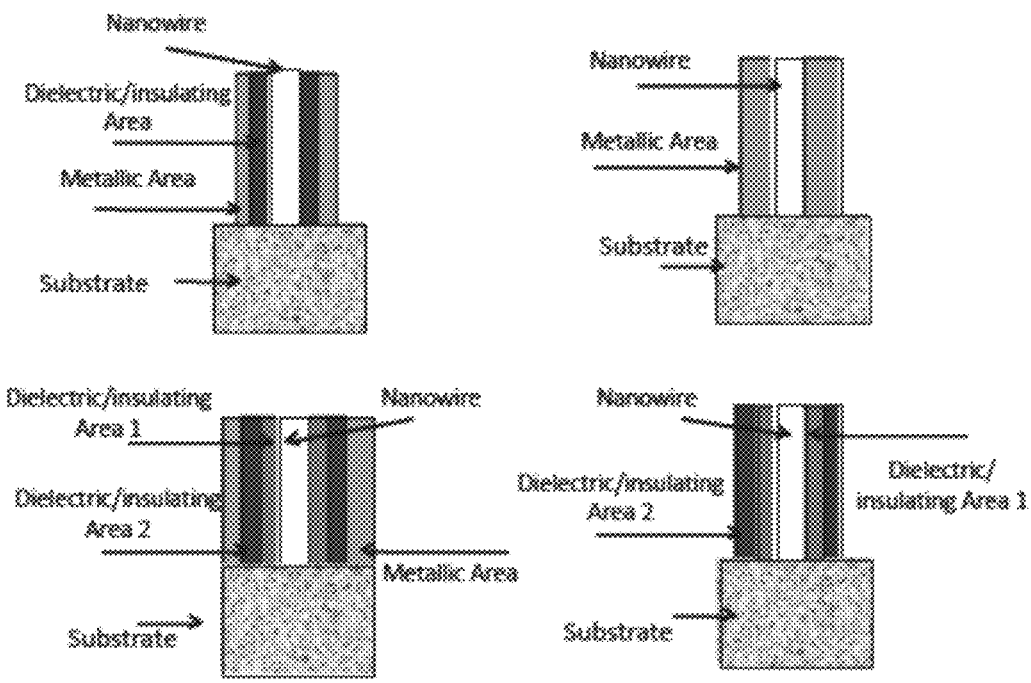
FIGS. 4A-B shows illustrative embodiments of different back side illuminated image sensors having photodiodes therein.
Figure 4B:
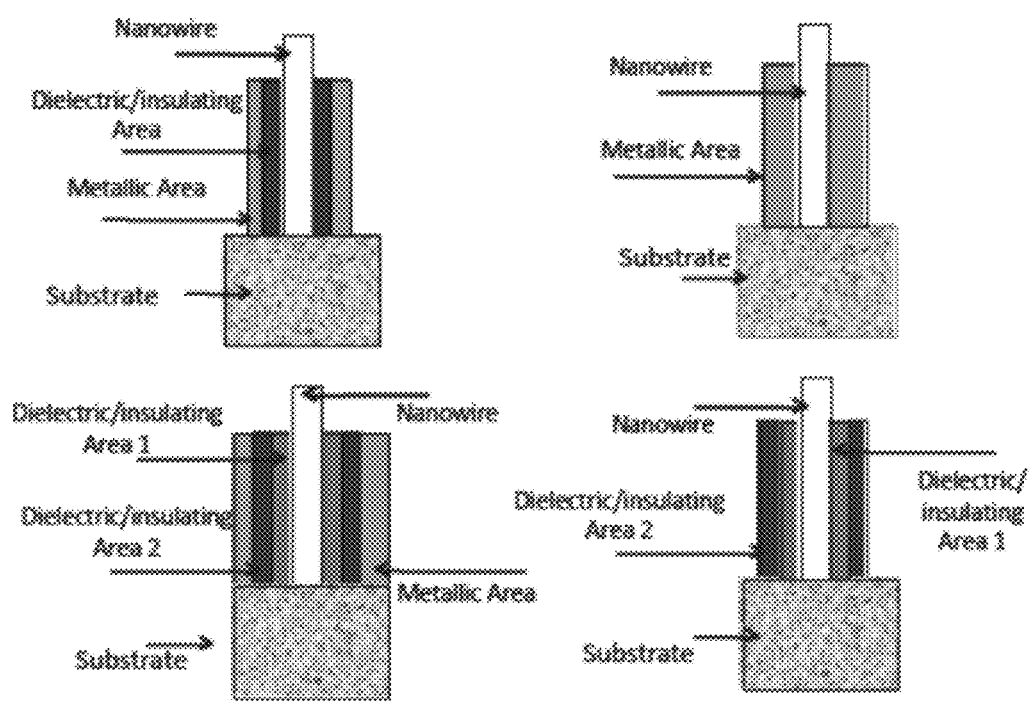
Figure 4C:
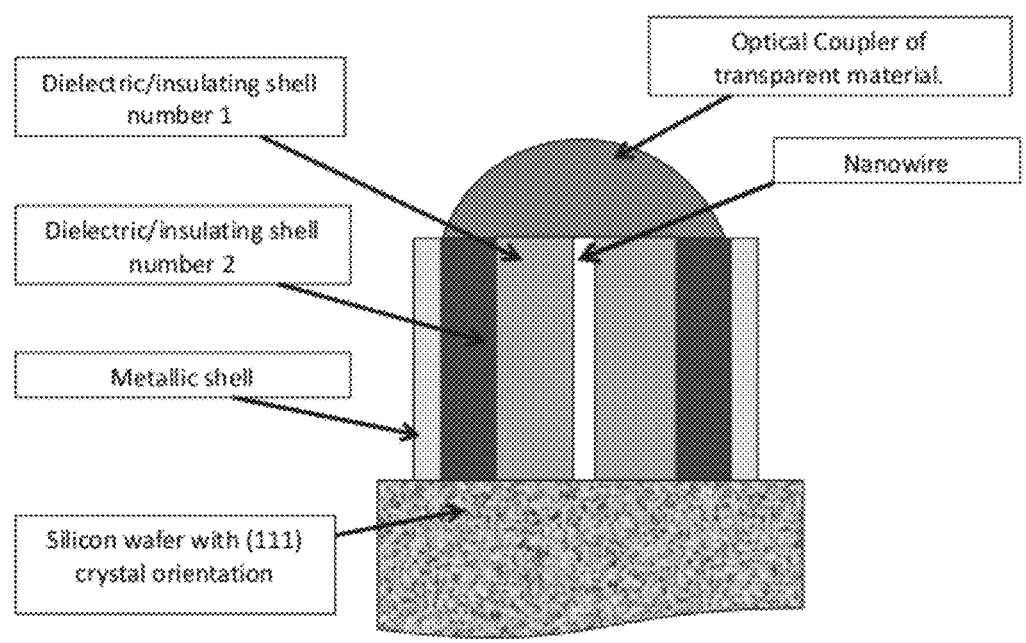
FIG. 4C shows an illustrative embodiment of a nanostructured waveguide with dimensions therein.

Examples of the structures of the backside thinned image sensor having photodiodes therein are shown in FIG. 4A and FIG. 4A. FIG. 4C shows an illustrative embodiment of a nanostructured waveguide with dimensions therein. The dimensions therein are purely for illustrative purpose to show the dimensions that one could use in an illustrative embodiment. However, other dimensions can also be used without deviating from the scope of the invention.

The BSI image sensor is useful for a variety of embodiments. For examples, as light detector devices by: (A) Creating the nanowire and associate structures on a silicon area located on the back of a conventional CMOS sensor circuitry, using the BSI image sensor. This method of back-illumination can be used for CCD and for enhancing the performance of a conventional CMOS imager. See for example: "A Back-Illuminated Mega Pixel CMOS Image Sensor" by: B. Pain et all in Proc 2007 Int. Image sensor Workshop, Pages 5-8, 2007; "Back-illuminated ultraviolet image sensor in silicon-on-sapphire" by: Jon Hyuk Park; E. Culurciello, in IEEE International Symposium on Circuits and Systems (ISCAS 2008) Seattle, Wash., 18-21 May 2008 Pages: 1854-1857. (B) Creating the nanowire and associate structures on an area located on top of the area that is normally designated for a photodiode. Thus, the substrate might be a dielectric.

The process diagrams here are for a case of silicon nanowires (NW) grown on a layer of silicon. The process can apply for growing Si NW on dielectric layer, or for III-V compound grown on the appropriate substrate, including Si substrate with or without a thin Molybdenum layer.

The device structure can include a low-doped ($\sim 3 \times 10^{14}$/cm$^3$) epitaxial p-type silicon, with the photo-detecting junction formed by a front-implanted n-well and the p-type epitaxial silicon. Photons enter the detector from the backside, and the resultant photo-electrons are collected in the front-side p-n well junction.

One embodiment can relate to a back-side illuminated image sensor having an optical pipe on the back-side of the substrate, the optical pipe comprising a core and a cladding so as to create a capacitor surrounding nanowire. The core can be made up of three layers, a semiconductor nanowire, an insulator and metal thus forming a capacitor to collect the charge generated by the light induced carriers in the nanowire. Contacts can be made to the metal and to the semiconductor nanowire to control and detect the stored charge. The core of the embodiments can function as a waveguide and a photodiode. The cladding can comprise a peripheral waveguide and a peripheral photodiode located in or on the silicon substrate of the optical sensor.

The integrated circuit (IC) in the silicon wafer substrate may optionally have active devices therein, a peripheral photodiode in or on the silicon wafer, stacking layers containing metallization layers and intermetal dielectric layers, and a passivation layer. The thickness of the stacking layers can generally be around 6 to 10 μm. The method of manufacturing the IC by planar deposition techniques is well-known to persons of ordinary skill in the art. A substrate containing the IC shown in FIG. 2 can be starting point for the manufacture of the embodiments of back-side illuminated sensor.

The substrate can then be thinned at an individual die level using a frame-thinning approach. The pixel area can be thinned down to about 7-10 μm thickness (corresponding to epitaxial silicon thickness), leaving a thick peripheral region (about 1 mm wide). A surface passivation step can then be applied to the thinned silicon layer. The resultant structure provides increased mechanical stability, a significant ease of die handling, and protection against wrinkling of the thinned die. This approach is well suited for a CMOS imager, since the imager consists not only of the pixels, but the support and signal chain electronics along the periphery of the pixel array.

Backside thinning can be carried out as follows. First, the front-side of the die would be attached to a protective wax. Then a protective frame on the backside would be created through deposition and patterning of a $Si_3N_4$ mask. The unmasked p+ silicon substrate (with doping about $1 \times 10^{19}$/cm$^3$) can then be etched using hot KOH, for example, down to within about 10 µm of the final silicon thickness. The remainder of the etching can be carried out in a bath having hydrofluoric acid, nitric acid and acetic acid solution (HF:HN0$_3$:CH$_3$COOH called HNA). HNA etches silicon through a redox reaction where the silicon oxidation rate is dependent on the doping concentration. Due to its doping concentration dependence, the etch-rate significantly slows down when the silicon substrate is etched, leaving an optically flat thin (about 10 pm thick) epitaxial silicon layer. Following thinning, the front-side wax can be removed, and the die can packaged in a standard pin-grid array (PGA) package (with its central portion removed to let light in) using a standard wire-bonding technique.

Subsequent to thinning, delta-doping technique can optionally be used for surface passivation. The technique includes a low temperature molecular beam epitaxy (MBE) that places an extremely high density of dopant atoms ($>10^{14}$ Boron/cm$^2$) within a few atomic layers of the surface with no observable crystal defects and no requirement for post-growth annealing, making it compatible with post-metallization processing. Delta-doping should be carried out under ultra-high vacuum conditions ($10^{-10}$ torr) using electron-beam evaporation of elemental silicon and thermal evaporation of elemental boron. The process steps can be as follows. A 1 nm-thick (p+) silicon layer can be grown first, followed by depositing about 30% of a monolayer of boron atoms. A 1.5 nm-thick capping layer of epitaxial silicon is then grown. After removal from the MBE system, oxidation of the silicon capping layer protects the buried delta-doped layer. The resultant optically flat surface allows easy deposition of anti-reflection coating using deposited oxides and plasma-enhanced silicon nitrides.

The subsequent steps for the manufacture of the embodiments of the back-side illuminated sensor can be as follows. The silicon nanowire of the embodiments disclosed herein can be made as follows. A substrate can be silicon optionally having a silicon dioxide surface. For example, for growing vertically oriented nanowires, Si substrate in the (111) orientation can be used. The gold patches can normally be deposited on this surface. The surface can be modified with a surface treatment to promote adsorption of a gold nanoparticle. Onto this modified surface, the gold nanoparticle can be formed by deposition of a gold layer, followed by removal of the gold layer over regions other than the desired location of the gold nanoparticle. The gold nanoparticle can be surface treated to provide for steric stabilization. In other words, tethered, sterically stabilized gold nanoparticles can be used as seeds for further synthesis of nanowires, wherein the gold nanoparticles are adsorbed to the modified silicon substrate. The degradation of diphenyl silane (DPS) forms silicon atoms. The silicon atoms attach to the gold nanoparticle and a silicon nanowire crystallizes from the gold nanoparticle seed upon saturation of the gold nanoparticle with silicon atoms. Note that the thickness and diameter of the gold particle left behind on the back-side surface determines the diameter of the nanowire.

In some embodiments, silicon NWs (SiNW) are grown using the vapor-liquid-solid (VLS) growth method. In this method, a metal droplet catalyzes the decomposition of a Si-containing source gas. Silicon atoms from the gas dissolve into the droplet forming a eutectic liquid. The eutectic liquid functions as a Si reservoir. As more silicon atoms enter into solution, the eutectic liquid becomes supersaturated in silicon, eventually causing the precipitation of Si atoms. Typically, the Si precipitates out of the bottom of the drop, resulting in bottom up growth of a Si—NW with the metal catalyst drop on top.

In some embodiments, gold is used as the metal catalyst for the growth of silicon NWs. Other metals, however, may be used, including, but not limited to, Al, GA, In, Pt, Pd, Cu, Ni, Ag, and combinations thereof. Solid gold may be deposited and patterned on silicon wafers using conventional CMOS technologies, such as sputtering, chemical vapor deposition (CVD), plasma enhanced chemical vapor deposition (PECVD), evaporation, etc. Patterning may be performed, for example, with optical lithography, electron-beam lithography, or any other suitable technique. The silicon wafer can then be heated, causing the gold to form droplets on the silicon wafer. Silicon and gold form a eutectic at 19% Au having a melting temperature at 363° C. That is, a liquid drop of Si—Au eutectic forms at 363° C., a moderate temperature suitable for the processing of silicon devices.

In some embodiments, the substrates have a (111) orientation. Other orientations, however, may also be used, including, but not limited to (100). A common silicon source gas for NW production is $SiH_4$. Other gases, however, may be used including, but not limited to, $SiCl_4$. In some embodiments, NW growth may be conducted, for example, with $SiH_4$ at pressures of 80-400 mTorr and temperatures in the range of 450-600° C. In some embodiments, the temperature is in a range of 470-540° C. Typically, lower partial pressures of $SiH_4$ result in the production of a higher percentage of vertical nanowires (NW). For example, at 80 mTorr partial pressure and 470° C., up to 60% of the SiNWs grow in the vertical <111> direction. In some embodiments, NWs may be grown which are essentially round. In other embodiments, the NW are hexagonal.

In one embodiment, NW growth is conducted in a hot wall low pressure CVD reactor. After cleaning the Si substrates with acetone and isopropanol the samples may be dipped in a buffered HF solution to remove any native oxide. Successive thin Ga and Au metal layers (nominally 1-4 nm thick) may deposited on the substrates by thermal evaporation. Typically, the Ga layer is deposited before the Au layer. In an embodiment, after evacuating the CVD-chamber down to approximately $10^{-7}$ torr, the substrates can be heated up in vacuum to 600° C. to form metal droplets. The Si—NWs can be grown, for example, at a total pressure of 3 mbar using a 100 sccm flow of $SiH_4$ (2% in a He mixture) in a temperature range from 500° C. to 700° C.

The size and length of the Si—NWs grown with a Au—Ga catalyst are relatively homogeneous, with most of the wires oriented along the four <111> directions. For comparison, Si-NWs grown with a pure Au catalyst nucleate and grow with lengths and diameters of the NWs more randomly distributed. Further, NWs grown with a Au—Ga catalyst tend to have a taper along the axial direction. The tip diameters of NWs grown for a long time are the same as those grown for a short time and are determined by the catalyst diameter. The footprints of the NWs, however, tend to increase during the course of the growth. This indicates that NW tapering is caused primarily by sidewall deposition (radial growth) of silicon. NWs may be grown having a diameter at the foot (base) of 1500 nm, while the diameter of the tip may less than 70 nm over a length of 15 µm. Further, the NW diameter is a function of growth temperature. Higher growth temperatures result in NW with smaller diameters. For example, the average diameter of NWs grown with the Ga/Au catalyst at 600° C. is about 60 nm but the average diameter decreases down to about 30 nm for growth at 500° C. Additionally, the variation in diameters tends to narrow as deposition temperature is lowered.

Using the VLS process, vertical NWs may be grown. That is, nanowires which are essentially perpendicular to the substrate surface. Typically, not all NW will be perfectly vertical. That is, the NWs may be tilted at an angle to the surface other than 90 degrees. Commonly observed tilted NWs include, but are not limited to, the three 70.5°-inclined <111> epitaxial growth directions and three additional 70.5°-inclined directions, which are rotated by 60°.

In addition to growing vertical NWs, the VLS process may be used to grow doped NWs. Indeed, by changing the composition of the source gases, a doping profile in the growing wire can be produced. For example, the NW can be made p-type by adding diborane ($B_2H_2$) or trimethyl borane (TMB) to the source gas. Other gases that add acceptor atoms to the silicon NW may also be used. The NW can be made n-type by adding $PH_3$ or $AsH_3$ to the source gas. Other gases that add donor atoms to the silicon NW may also be used. Doping profiles which can be produced, include but are not limited to, n-p-n, p-n-p, and p-i-n.

Additionally, other methods or variations of the VLS method may be used to grow NWs. Other methods or variation include, but are not limited to, (1) CVD, (2) reactive atmosphere, (3) Evaporation, (4) molecular beam epitaxy (MBE), (5) laser ablation, and (6) solution methods. In the CVD process, a volatile gaseous silicon precursor is provided. Example silicon precursor gases include $SiH_4$ and $SiCl_4$. CVD may be used for epitaxial growth. Further, doping can be accomplished by adding volatile doping precursors to the silicon precursor Annealing in a reactive atmosphere comprises heating the substrate in a gas that reacts with the substrate. For example, if silicon is annealed in an atmosphere including hydrogen, the hydrogen locally reacts with the silicon substrate, forming $SiH_4$. The $SiH_4$ can then react with the catalyst metal drop, thereby initiating NW growth. This growth process can be used for non-CMOS processes.

In the evaporation method, a $SiO_2$ source is heated under conditions that result in the production of SiO gas. When the SiO gas adsorbs on the metal catalyst droplets, it forms Si and $SiO_2$. This method may also be performed without a metal catalyst drop. Absent a metal catalyst, $SiO_2$ has been observed to catalyze silicon NW growth. In the MBE method, a high purity silicon source is heated until Si atoms evaporate. A gaseous beam of Si directed toward the substrate. The gaseous silicon atoms adsorb onto and dissolve into the metal droplet, thereby initiating growth of NWs.

In the laser ablation method, a laser beam is aimed at source which includes both silicon and catalyst atoms. The ablated atoms cool by colliding with inert gas molecules and condense to form droplets with the same composition as the original target. That is, droplets having both silicon and catalyst atoms. The laser ablation method may also be performed with a target consisting essentially of pure silicon. Solution based techniques typically use organic fluids. Specifically, the organic fluids generally comprise highly pressurized supercritical organic fluids enriched with a silicon source and catalyst particles. At a reaction temperature above the metal-silicon eutectic, the silicon precursor decomposes, forming an alloy with the metal. Upon supersaturation, silicon precipitates out, growing the NR.

The above nanowire growth techniques are all bottom up techniques. Nanowires, however may also be fabricated with top down techniques. Top down techniques typically involve patterning and etching a suitable substrate, for example silicon. Patterning can be accomplished via lithography, for, example, electron beam lithography, nanosphere lithography and nanoprint lithography. Etching may be performed either dry or wet. Dry etching techniques include, but are not limited to, reactive ion etching. Wet etching may be performed with either standard etches or via the metal-assisted etching process. In the metal-assisted etching process, Si is wet-chemically etched, with the Si dissolution reaction being catalyzed by the presence of a noble metal that is added as a salt to the etching solution.

Subsequent steps can relate to the forming of one or more of the dielectric layers around the nanowire on the back-side of the substrate. For example, a conformal dielectric coating by chemical vapor deposition (CVD), atomic layer deposition (ALD), oxidation or nitration can be made around the nanowire. Then, doped glass dielectric layer can be formed on the conformal dielectric coating by plasma enhanced chemical vapor deposition, spin-on coating or sputtering, optionally with an initial atomic layer deposition. The deposited doped glass dielectric layer can be etched back by chemical-mechanical planarization or other methods of etching.

A funnel and a lens on the funnel to channel electromagnetic radiation such as light into the nanowire waveguide can then be made as follows: deposition of a glass/oxide/dielectric layer by CVD, sputter deposition or spin-on coating; application of a photoresist on the deposited glass/oxide/dielectric layer; removal of the photoresist outside an opening centered over the nanowire within the deep cavity; and forming a coupler by semi-isotropic etching in the glass/oxide/dielectric layer.

Subsequent steps can relate to the forming of a metal layer around the one or more dielectric layers by depositing a metal such a copper on the vertical walls of the nanowire surrounding the one or more dielectric layers.

Another embodiment can relate to a back-side illuminated image sensor having an optical pipe comprising a core and a cladding with a pin or pn photodiode in a nanowire in the core.

The core can have a pn or pin junction that induces a potential gradient in the core wire. The pn or pin junction in the core can be formed by growing a nanowire and doping the nanowire core while it is growing as a pin junction. For example, the doping of the nanowire can have two levels of doping to form n and p, or in other embodiments, the nanowire can comprise p, i and n regions to form a pin photodiode. Yet, another possibility is doping the wire along its length in concentric circles to form p and n or p, i and n regions to form a pn or pin photodiode. The pn or pin junction nanowire (also referred to as a pn or pin photodiode) is contacted at the appropriate points along pn or pin junction nanowire using the various metal layers that are part of any device to detect the charge generated by the light induced carriers in the pn or pin junction nanowire. The cladding of the embodiments can comprise a peripheral waveguide and a peripheral photodiode located in or on the silicon substrate of the optical sensor.

The method of making the embodiments wherein the nanowire has a pn or pin junction is similar in many ways to the method of making the embodiment where the optical pipe has a capacitor type photodiode described above except that a modified version of the nanowire growth step is carried out, the step of depositing a conformal dielectric coating is omitted, and the step of depositing a metal on the vertical walls of the nanowire is omitted.

The nanowire growth step includes growing a nanowire having two or more different doped regions to form a pn photodiode by growing a N-doped (n-doped) nanowire followed by growing a P-doped (p-doped) nanowire or a pin photodiode by first growing a N-doped (n-doped) nanowire, then growing an I-doped nanowire (also referred to as the I-region of the nanowire), and finally growing a p-doped nanowire. The doping of the nanowire can be carried out by methods well known in the art.

In one embodiment, a shallow p-type implant can be disposed in the backside of the substrate. P-type implant can prevent electrons from within the substrate from gathering at backside surface of the substrate. If allowed to gather at the backside surface, these electrons can cause a portion of the incident light to be reflected, diminishing the amount of light incident on pixel array.

While preferably no color filter is disposed in the BSI image sensor, in one embodiment, a color filter array can be disposed on the backside of the substrate. Color filter array filters the light by color before the light illuminates the backside of the substrate. In one embodiment, an anti-reflective layer may be disposed on the substrate. The anti-reflective layer further reduces the reflection of incident light from the backside surface of the substrate. Alternatively, an anti-reflection layer may be disposed in other regions, for example, between the image sensor and an integrated lens stack.

Integrated lens stack can serve many purposes, such as focusing light, attenuating light, or concentrating one wavelength of light on the backside of the substrate. Integrated lens stack may include layers such as collimating lenses, focusing lenses, spacers, and mirrored layers. In one embodiment, the layers of integrated lens stack can be bonded together using a thermosetting resin. Alternatively, the layers of integrated lens stack can be coupled together using a UV-setting bonding process or another type of bonding process. Integrated lens stack also provides additional mechanical support. Embodiments of integrated lens stack with five lens layers or two lens layers can be commercially obtained through Anteryon BV, The Netherlands. Alternatively, integrated lens stacks with different numbers of lens layers from other lens manufacturers can be used.

In one embodiment, the backside surface is thinned until the substrate of image sensor wafer is approximately 1-10 micrometers thick, facilitating the detection of visible light. In an alternative embodiment, the backside of image sensor wafer is the proper depth to facilitate the detection of selected wavelengths of electromagnetic radiation, such as infrared light.

In one embodiment the pixel array is located, as much as possible, approximately in the center of a die, with electronics surrounding pixel array. Alternatively, pixel array can be located off-center on die, with electronics distributed on the remainder of die.

It should be noted that the backside thinned image sensor with an integrated lens stack discussed herein might be used in various applications. In one embodiment, backside thinned image sensor with an integrated lens stack may be used in a digital camera system, for example, for general-purpose photography (e.g., camera phone, still camera, video camera) or special-purpose photography. Digital camera can include a display, device, and subsystems that are coupled together via bus. The subsystems may include, for example, hardware, firmware and/or software for storage, control, and interface operations of the camera system that are known to one of ordinary skill in the art; accordingly, a detailed description is not provided. Alternatively, image sensor can be used in other types of applications, for example, machine vision, document scanning, microscopy, security, biometrics, etc.

According to the embodiments of the invention, strategies for minimizing the reflection of incident light on the substrate of the cavity is to provide an anti-reflective coating in or on the substrate of the cavity. An anti-reflective coating acts to reduce the reflection at the surface, allowing a higher level of visible light transmission. Anti-reflective or antireflection (AR) coatings are a type of optical coating applied to the surface of optical devices to reduce reflection. This improves the efficiency of the system since less light is lost. The methods for implementing anti-reflective coatings include the use of alternating layers of a low-index material like silica and a higher-index material to obtain reflectivity as low as 0.1% at a single wavelength or over a range of wavelengths.

In one embodiment, the anti-reflective material can work near a single light frequency. Other embodiments can use a green antireflective coating, for example, on the substrate of the cavity containing the blue absorbing nanowire, and a red anti-reflective coating with a cyan absorbing nanowire.

Many AR coatings have transparent thin film structures with alternating layers of contrasting refractive index. Layer thicknesses are chosen to produce destructive interference in the beams reflected from the interfaces, and constructive interference in the corresponding transmitted beams. This makes the structure's performance change with wavelength and incident angle, so that color effects often appear at oblique angles. A wavelength range must be specified when designing or ordering such coatings, but good performance can often be achieved for a relatively wide range of frequencies: usually a choice of IR, visible, or UV is offered.

The simplest interference AR coating can be a single quarter-wave layer of transparent material whose refractive index is the square root of the substrate's refractive index. This theoretically gives zero reflectance at the center wavelength and decreased reflectance for wavelengths in a broad band around the center. By using alternating layers of a low-index material like silica and a higher-index material it is possible to obtain reflectivities as low as 0.1% at a single wavelength.

One embodiment of the AR coating can be ultraviolet anti-reflection (UAR) coating. This ultraviolet anti-reflection coating can reduce surface reflection from quartz, fused silica, semiconductor silicon substrates to less than 0.3% from 0.2 to 0.3 microns. UAR coatings are designed to promote effective transmission of light in the ultraviolet wavelengths.

Anti-reflective coatings include several different sub-layers comprising many different materials such as, but not limited to, $Al_2O_3$, $ZrO_3$, $MgF_2$, $SiO_2$, cryolite, LiF. $ThF_4$, $CeF_3$, $PbF_2$, ZnS, ZnSc, Si, Te, MgO, $Y_2O_3$, $Sc_2O_3$, SiO, $HfO_2$, $ZrO_2$, $CeO_2$, $Nb_2O_3$, $Ta_2O_5$, and $TiO_2$. The thickness of each sublayer is often related to an even whole number division of the wavelength of light that is most preferred to be transmitted through the coated material.

Figure 5:
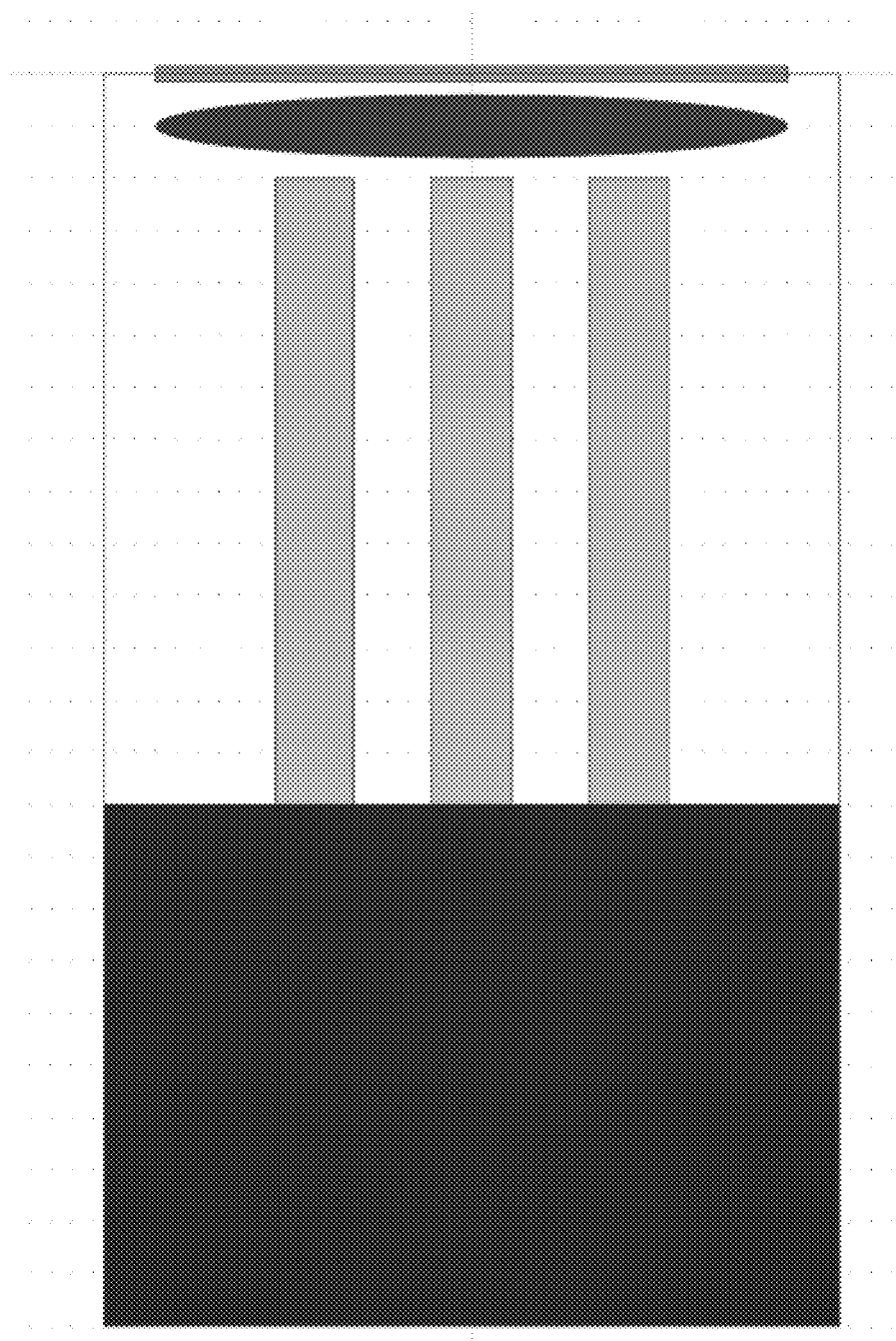
FIG. 5 shows an illustrative embodiment of an array of nanowires within a single cavity of the image sensor of an embodiment.

In other embodiments, the can be multiple nanowires in a single deep cavity as shown in FIG. 5 wherein at the bottom is a silicon substrate on which there is an array of nanowires over which is a coupler (shown as an oval), and over the coupler is a region (shown as rectangular box) through which light comes in to the coupler.

The recognition of color and luminance by the embodiments of the image sensors can be done by color reconstruction. Each compound pixel has complete luminance information obtained by combining its two complementary outputs. As a result, the same image sensor can be used either as a full resolution black and white or full color sensor.

The color reconstruction can be done to obtain full color information by the appropriate combination of two adjacent pixels, which can be one embodiment of a compound pixel, either horizontally or vertically. The support over which color information is obtained is less than the dimension of two pixels as opposed to 4 for the Bayer pattern.

Figure 6:
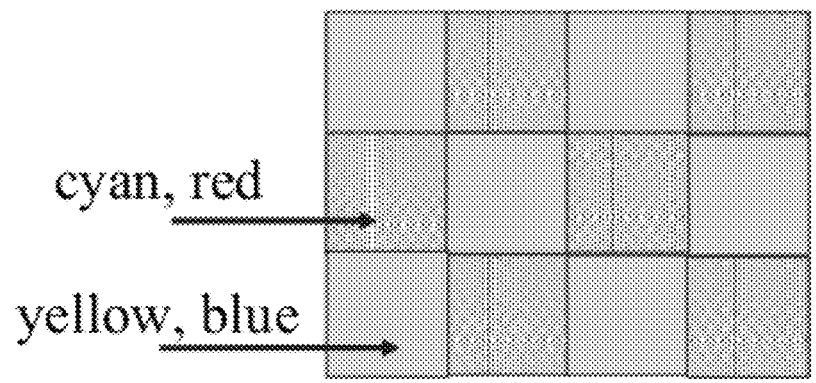
FIG. 6 shows an illustrative embodiment of a schematic of a top view of a device containing image pixels of the embodiments disclosed herein, each image pixel having two outputs representing the complementary colors.
Figure 7:
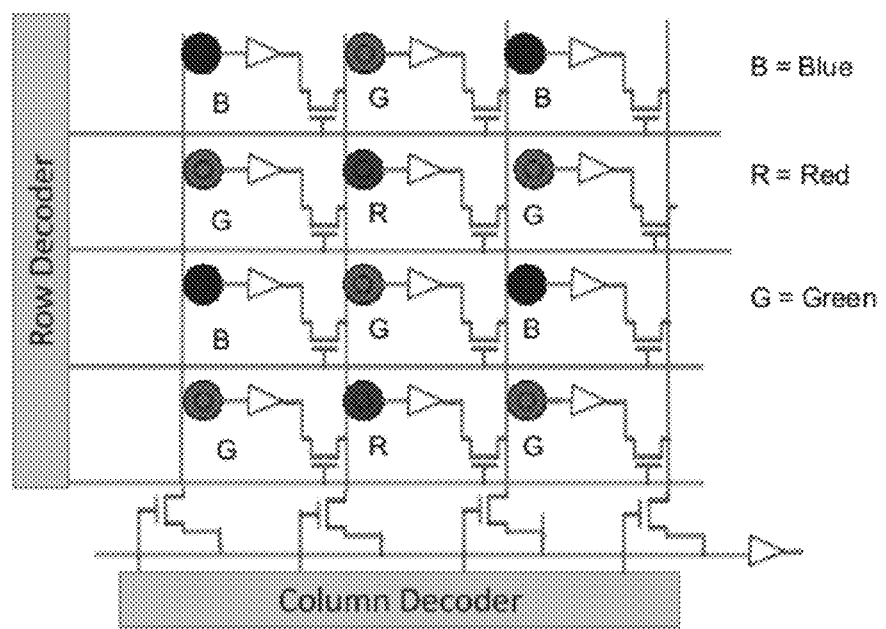
FIG. 7 shows an illustrative embodiment of an array of nanostructured waveguides showing 3 types of pixels (red, green, and blue in a tessellation).

Each physical pixel of a device containing an image sensor of the embodiments disclosed herein can have two outputs representing the complementary colors, e.g., cyan, red (C, R) designated as output type 1 or yellow, blue (Y, B) designated as output type 2 as shown in FIG. 6. These four outputs of two pixels of a compound pixel can be resolved to reconstruct a full color scene of an image viewed by a device containing the image sensors of the embodiments described herein. At least some of the two pixels can have two outputs representing the complementary colors, e.g., white-Red, Red (W-R, R) designated as output type 1 or white-Blue, Blue (W-B, B) designated as output type 2. FIG. 7 shows an array of nanostructured waveguides showing 3 types of color pixels (red, green, and blue in conventional tessellation). Note that 2 color pixels only (for example, blue and green) can be also used when planar photodiodes are added, in each pixel, to the nanowire photodetector.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A waveguide comprising a substrate, at least one upstanding nanowire protruding from the substrate, and a vertical photogate covering a lateral surface of the at least one upstanding nanowire; wherein the at least one upstanding nanowire comprises a pn-junction or a pin-junction; wherein the nanowire has a first effective refractive index, $n_w$, and a material surrounding at least a portion of the nanowire to form a cladding has a second effective refractive index, $n_c$, and the first refractive index is larger than the second refractive index, $n_w > n_c$ configured to create waveguiding properties of the waveguide.

2. The waveguide according to claim 1, wherein a shell-like structure encloses the nanowire or portion thereof.

3. The waveguide according to claim 1, wherein the waveguide forms a defined angle with the substrate and the defined angle between nanowire and substrate is selected to create a vertical or close to vertical orientation.

4. The waveguide according to claim 1, wherein the waveguide is provided with at least one cladding layer.

5. The waveguide according to claim 4, wherein the one cladding layer is an optical cladding layer configured to enhance wave-guiding properties of the waveguide.

6. The waveguide according to claim 4, wherein a plurality of cladding layers provide a graded refractive index towards a boundary of the nanowire.

7. The waveguide according to claim 4, wherein the cladding layer comprises a metal to create electrical connection.

8. The waveguide according to claim 1, wherein an active region is arranged within the nanowire.

9. The waveguide according to claim 8, wherein the pn junction or the pin-junction is formed by doping the nanowire.

10. The waveguide according to claim 1, wherein the nanowire is arranged to direct light in downward direction towards the substrate.

11. The waveguide according to claim 1, comprising a planar photodetector under the at least one nanowire.

12. The waveguide according to claim 1, wherein the nanowire is configured to detect infrared light.

13. The waveguide according to claim 1, further comprising a filter that allows passage of infrared light but not visible light.

14. The waveguide according to claim 1, wherein the nanowire comprises GaAs.

15. The waveguide according to claim 11, wherein the planar photodetector is configured to detect infrared light.

16. The waveguide according to claim 11, wherein the planar photodetector comprises GaAs.

* * * * *